(12) United States Patent
Azami

(10) Patent No.: US 6,567,067 B2
(45) Date of Patent: May 20, 2003

(54) LEVEL SHIFTER

(75) Inventor: Munehiro Azami, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/092,447

(22) Filed: Mar. 8, 2002

(65) Prior Publication Data

US 2002/0118159 A1 Aug. 29, 2002

Related U.S. Application Data

(62) Division of application No. 09/797,697, filed on Mar. 5, 2001, now Pat. No. 6,384,808.

(30) Foreign Application Priority Data

Mar. 14, 2000 (JP) ........................................ 2000-071256

(51) Int. Cl.[7] ................................................. G09G 3/36
(52) U.S. Cl. ........................................ 345/100; 365/226
(58) Field of Search .............................. 345/87, 90, 91, 345/92, 98, 100; 327/94, 333, 108, 543; 365/226, 185.18, 185.09, 189.11

(56) References Cited

U.S. PATENT DOCUMENTS

| | | | |
|---|---|---|---|
| 5,191,233 A | 3/1993 | Nakano | |
| 5,399,915 A | 3/1995 | Yahata | |
| 5,467,043 A | 11/1995 | Ohi | |
| 5,867,138 A | 2/1999 | Moon | |
| 6,191,779 B1 | 2/2001 | Taguchi et al. | |
| 6,292,183 B1 | 9/2001 | Yamazaki et al. | |

Primary Examiner—Chanh Nguyen
(74) Attorney, Agent, or Firm—Fish & Richardson P.C.

(57) ABSTRACT

A compact level shifter is provided, which has a low consumption power and speedy operation, capable of easily performing a level conversion of voltage levels having a large difference. A voltage regulating circuit (10a), a P channel MOS, electric field effect transistor (hereinafter referred to as PMOST), a PMOST (103). and an N channel MOS electric field effect transistor (hereinafter referred to as NMOST) (105) are connected in series between 2 power sources. Similarly, a voltage regulating circuit (10b), a PMOST (102), a PMOST (104), and an NMOST (106) are connected in series between 2 power sources. During the flow of a penetrating current in a transient period of a level conversion operation, a power source voltage is effectively reduced by the above-mentioned voltage regulating circuit, whereby the level conversion of the voltage level having a large difference is made easy.

42 Claims, 18 Drawing Sheets

Fig. 16B

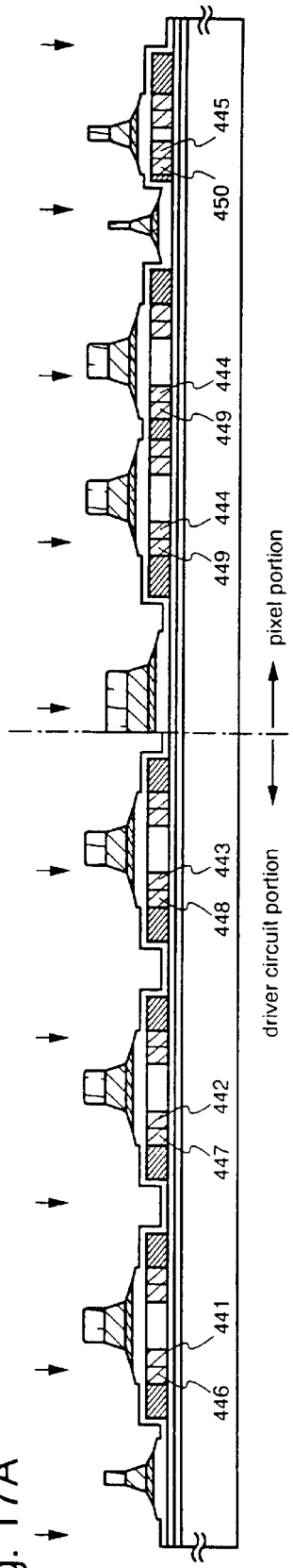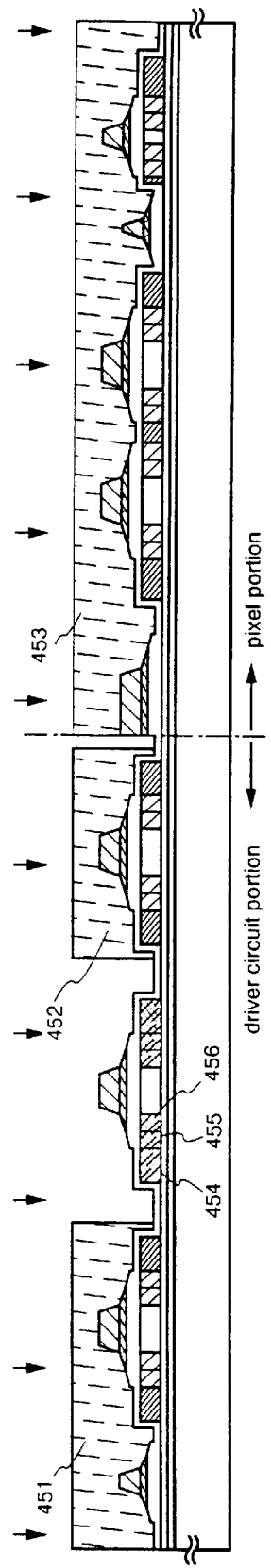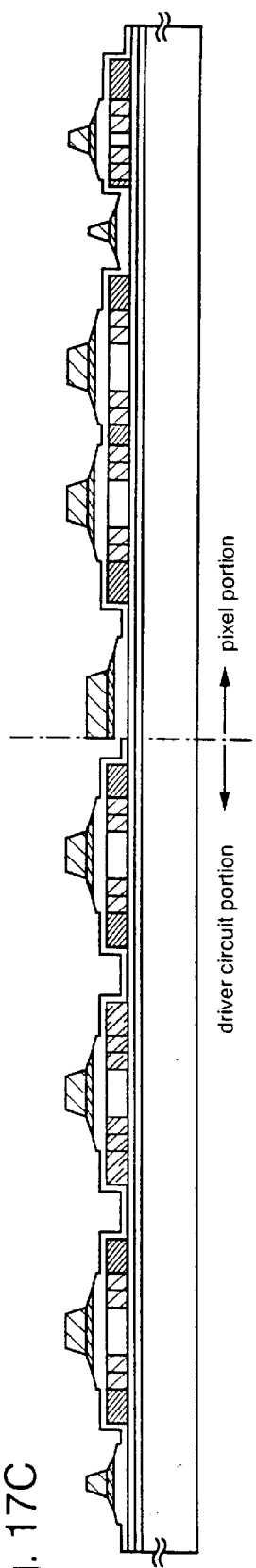

US 6,567,067 B2

LEVEL SHIFTER

CROSS-REFERENCE TO RELATED APPLICATIONS

This application is a divisional of U.S. Ser. No. 09/797,697, filed Mar. 5, 2001 now U.S. Pat. No. 6,384,808.

BACKGROUND OF THE INVENTION

1. Field of the Invention

The present invention relates to a level shifter that is employed in a driver circuit of an image display device (active matrix image display device) for displaying information such as an image by means of switching elements and pixels arranged in matrix.

2. Description of the Related Art

In recent years, the fining of a technique in manufacturing semiconductors is advancing. Further, because of the popularized electronic equipment such as a portable equipment which demands low consumption power, the LSI that is used in these equipments has become 3.3 V, that is, a 3.3 V low power source voltage drive has become the mainstream. On the other hand, in a liquid crystal display, which is recently in high demand for its use as a monitor of a portable terminal, computer, etc., a liquid crystal drive is conducted by a 10 to 20 V of voltage amplitude signal. Thus, it has become necessary to provide at least a circuit portion that operates at a high power source voltage corresponding to the voltage amplitude of the driver circuit thereof.

Therefore, between the low voltage amplitude signal of a controller LSI and the high voltage amplitude signal that is necessary to drive the liquid crystal display, a level shifter for performing a voltage amplitude conversion becomes indispensable.

A conventional level shifter that is generally used is shown in FIG. 23. This level shifter converts a signal having a 0 to VDD1 (>0, for example 5 V) voltage amplitude to a signal having a 0 to VDD2 (>VDD1, for example 10 V) voltage amplitude. That is, it is a level shifter which shifts a high electric potential side while a low electric potential side is fixed. The structure thereof is as follows. A source of a P channel MOS transistor (hereinafter abbreviated as PMOST) 101 and a source of a PMOST 102 are each connected to a power source VDD2, and a drain of the PMOST 101 is connected to a source of a PMOST 103 while a drain of the PMOST 102 is connected to a source of a PMOST 104, respectively. Further, a drain of the PMOST 103 is connected to a gate of the PMOST 102 and to a drain of an N channel MOS transistor (hereinafter abbreviated as NMOST) 105, and drain of the PMOST 104 is connected to a gate of the PMOST 101 and to a drain of an NMOST 106. A source of the NMOST 105 and a source of the NMOST 106 are connected to a GND (0 V). Furthermore, an input signal (IN) is fed to the gate of the PMOST 103 and that of the NMOST 105 while an inverted input signal (/IN) of the input signal (IN) is fed to the gate of the PMOST 104 and that of the NMOST 106, respectively, to thereby extract an output signal (OUT) from the drain of the NMOST 106. It is to be noted that an inverted output signal (/OUT) of the above output signal can be extracted from the drain of the NMOST 105.

Note that in regards to the power source voltage, the VDD# of the power source is expressed as power source VDD# (where # denotes a number) throughout the present specification. Further, GND, VDD1, VDD2, VDD3, and VDD4 will be taken as the 5 kinds of power source voltage and their relationship according to the voltage level satisfies VDD4<VDD3<GND<VDD1<VDD2. However, the voltage of GND is set to 0 V in order to simplify the explanation.

A basic operation of the example of the conventional level shifter will be explained next. When the electric potential of the input signal (IN) is "Hi" of VDD1, then the NMOST 105 is turned ON and the PMOST 103 is turned OFF, whereby the electric potential "Lo" of GND is fed to the gate of the PMOST 102 to thereby turn the PMOST 102 ON. On the other hand, the electric potential of the inverted input signal (/IN) is "Lo" of GND, and thus the NMOST 106 is turned OFF while the PMOST 104 is turned ON. Therefore, both PMOSTs 102 and 104 are turned ON and the electric potential is shifted, whereby the output signal (OUT) becomes "Hi" of VDD2. It is to be noted that the PMOST 101 becomes OFF to thereby ensure that the gate of the PMOST 102 is held at the "Lo" level of GND by the electric potential.

When the electric potential of the input signal (IN) is "Lo" of GND, the level shifter shown in FIG. 23 takes a symmetrical structure. Thus, similar to the above, it can be comprehended that the electric potential "Lo" of GND (0 V) is outputted from the output terminal (OUT).

Accordingly, a signal having a voltage amplitude of 0 to VDD1 is thus converted to a signal having a voltage amplitude of 0 to VDD2.

Next, an example of a conventional level shifter which shifts the low electric potential side while the high electric potential side is fixed is shown in FIG. 24. This level shifter converts a signal having a VDD3 (<0) to 0 voltage amplitude to a signal having a VDD4 (<VDD3) to 0 voltage amplitude. The structure thereof is as follows. A source of an NMOST 107 and a source of an NMOST 108 are each connected to the power source VDD4, and a drain of the NMOST 107 is connected to a source of an NMOST 109 while a drain of the NMOST 108 is connected to a source of an NMOST 110, respectively. Further, a drain of the NMOST 109 is connected to a gate of the NMOST 108 and to a drain of a PMOST 111, and drain of the NMOST 110 is connected to a gate of the NMOST 107 and to a drain of a PMOST 112. A source of the PMOST 111 and a source of the PMOST 112 are connected to the GND (0 V). Furthermore, an input signal (IN) is fed to the gate of the NMOST 109 and that of the PMOST 111 while an inverted input signal (/IN) of the input signal (IN) is fed to the gate of the NMOST 110 and that of the PMOST 112, respectively, to thereby extract an output signal (OUT) from the drain of the PMOST 112. It is to be noted that an inverted output signal (/OUT) of the above output signal (OUT) can be extracted from the drain of the PMOST 111.

A basic operation of the example of the conventional level shifter shown in FIG. 24 will be explained next. When the electric potential of the input signal (IN) is "Lo" of VDD3, then the PMOST 111 is turned ON and the NMOST 109 is turned OFF, whereby the electric potential "Hi" of GND is fed to the gate of the NMOST 108 to thereby turn the NMOST 108 ON. On the other hand, the electric potential of the inverted input signal (/IN) is "Hi" of GND, and thus the PMOST 112 is turned OFF while the NMOST 110 is turned ON. Therefore, both NMOSTs 108 and 110 are turned ON and the electric potential is shifted, whereby the output signal (OUT) becomes "Lo" of VDD4. It is to be noted that the NMOST 107 becomes OFF to thereby ensure that the gate of the NMOST 108 is held at the "Hi" level of GND by the electric potential.

When the electric potential of the input signal (IN) is "Hi" of GND, the level shifter shown in FIG. 24 takes a symmetrical structure. Thus, similar to the above, it can be comprehended that the electric potential "Hi" of GND is outputted from the output terminal (OUT).

Accordingly, the signal having a voltage amplitude of VDD3 to 0 is thus converted to a signal having a voltage amplitude of VDD4 to 0.

The above described example of the conventional level shifter can comparatively easily perform level conversion between voltage amplitudes having a small difference. However, as the difference between the voltage amplitudes becomes large, it becomes more difficult for the level shifter to perform level conversion, resulting in the occurrence of problems. These problems will be explained in the following.

Although the basic operation of the exemplified conventional level shifter was simply explained in the above, precisely, points such as to perform an operation or not or the operating time are determined depending on the voltage amplitude to be converted, the characteristic of the transistor, and the like. In the level shifter shown in FIG. 23, for example, let's assume that VDD1=5 V, VDD2=15 V, a threshold voltage of the PMOST 101 to 104 is −2 V, and a threshold voltage of the NMOST 105 and 106 is 2 V. Under these conditions and under a steady state of a normal operating time as well, if the electric potential of the input signal (IN) is changed from the "Lo" of 0 V to the "Hi" of 5 V, then the voltage between the gate and the source of the NMOST 105 exceeds the threshold voltage thereof, thereby turning the NMOST 105 ON. On the other hand, because the source electric potential of the PMOST 103 is initially 15 V, the voltage between the gate and the source the PMOST 103 is −10 V, which exceeds the threshold voltage thereof, and the PMOST 103 is also turned ON. The PMOST 101 is also in the ON state initially, and therefore a penetrating current flows between the power source VDD2 and GND through the PMOST 101, 103 and the NMOST 105. This state is in continuation as far as the PMOST 101 or the PMOST 103 is not turned OFF. Consequently, in order to avoid this penetrating current, 1) a method of turning the PMOST 101 OFF, and then 2) a method of turning the PMOST 103 OFF is considered.

1) A Method of Turning OFF the PMOST 101

In order to turn the PMOST 101 OFF, it is necessary to turn the PMOST 102 and 104 ON to receive a charge supplied from the power source VDD2 that is connected to the source of the PMOST 102 to thereby raise the gate electric potential of the PMOST 101 to 13 V or more. The electric potential of the inverted input signal (/IN) of the input signal (IN) is "Lo" of 0 V, and hence the NMOST 106 is turned OFF and the PMOST 104 is turned ON. If the PMOST 102 is turned ON, then the NMOST 106 is turned OFF. Therefore, the gate electric potential of the PMOST 101 can be rapidly charged up to 15 V without the penetrating current flowing. In order to do this, nevertheless, the gate electric potential of the PMOST 102 must be lower than 13 V, that is, it is necessary to discharge a charge to the GND from the gate of the PMOST 102 through the NMOST 105. However, as mentioned before the discharge from the gate of the PMOST 102 is not adequate due to the penetrating current flowing through the PMOST 101, 103 and the NMOST 105. As a result, by designing the PMOST 101, 103 and the NMOST 105 under the condition that the penetrating current is flowing so that the drain electric potential of the NMOST 105 is smaller than 13 V, then the PMOST 101 can be turned OFF.

2) A Method of Turning OFF the PMOST 103

To turn the PMOST 103 OFF, it is necessary to raise the voltage between the gate and the source thereof to −2 V or more. Because the electric potential of the input signal (IN) is 5 V, similarly, the gate electric potential of the PMOST 103 is 5 V. Therefore, the source electric potential of the PMOST 103 must be reduced to 7 V or less. In this case also, by designing, under the condition that the penetrating current is flowing, the PMOST 101, 103 and the NMOST 105 so that the source electric potential of the PMOST 103 is less than 7 V, then the PMOST 103 can be turned OFF.

In any case, in the above 2 methods, the design of the PMOSTs 101, 103 and the NMOST 105 must be made with the ON resistance taken into consideration so that even if the penetrating current is flowing, level conversion can be conducted by cutting the flow of the penetrating current. Further, in order to operate speedily, the current that flows from the power source VDD2 that is connected to the source of the PMOST 101 to the gate of the PMOST 102 via the PMOST 101 and 103 must be suppressed. This has to do with whether or not to increase the current flowing out to the GND from the gate of the PMOST 102 via the NMOST 105. To swiftly raise the output (OUT) to "Hi" once the PMOST 102 is turned ON, the current drive ability of the PMOST 102 and 104 must also be taken into consideration.

Regarding the input signal (IN), when the electric potential thereof changes to "Lo" of 0 V from "Hi" of 5 V, the roles of the PMOST 101 and 102, the PMOST 103 and 104, the NMOST 105 and 106 are merely exchanged, respectively. Therefore, it is also acceptable to replace the respective transistors in the above described operation.

Accordingly, regarding the exemplified conventional level shifter of FIG. 23, the PMOST 101 to 104 has the lowest current driving ability, and hence the point here is to design the NMOST 105 and 106 so that they have a higher current driving ability when compared with that of the PMOST 101 to 104. In accordance therewith, it is appropriate to design the channel width of the NMOST 105 and 106 longer as voltage amplitudes having a large difference become larger for level conversion. However, the level shifter itself becomes big, and an input gate capacitance is also increased, whereby a circuit of an upper current becomes large as well. Consequently, this invites an increase of the area occupied by the circuit.

The same thing can be observed in regards to the exemplified conventional level shifter of FIG. 24.

SUMMARY OF THE INVENTION

The present invention has been made in view of the above problem, and therefore has an object to provide a new level shifter that reduces the consumption power which originates from a penetrating current that occurs during a transient period of an operation, make a level conversion of voltage amplitudes having a large difference easy, and improve its operational speed as well whereby an increase of an area occupied by a circuit is repressed.

According to an aspect of the present invention, there is provided a level shifter comprising a first MOS transistor of a first conductive type having a source that is connected to a first power source and a gate to which a first input signal is inputted, and a second MOS transistor of a conductive type that is similar to the first conductive type having a source that is connected to the first power source and a gate to which a second input signal that is an inverted signal of the first input signal is inputted.

Further, the level shifter of the present invention has a third MOS transistor of a second conductive type, which is a conductive type that is different from the first conductive type, having a drain that is connected to a drain of the first MOS transistor and a gate to which the first input signal is inputted, and a fourth MOS transistor of a conductive type that is similar to the second conductive type having a drain that is connected to a drain of the second MOS transistor and a gate to which the second input signal is inputted.

Further, the level shifter of the present invention has a fifth MOS transistor of a conductive type that is similar to the second conductive type having a drain that is connected to a source of the third MOS transistor and a gate that is connected to a drain of the second MOS transistor, and a sixth MOS transistor of a conductive type that is similar to the second conductive type having a drain that is connected to a source of the fourth MOS transistor and a gate that is connected to a drain of the first MOS transistor.

Still further, the level shifter of the present invention has a first voltage regulating circuit that is connected between a source of the fifth MOS transistor and a second power source, and a second voltage regulating circuit that is connected between a source to the sixth MOS transistor and the second power source.

This level shifter converts the first and second input signals of a first voltage amplitude to a signal of a second voltage amplitude to thereby output a signal from at least one of a drain of the first MOS transistor or a drain of the second MOS transistor. In a transient period of a level conversion operation, the 2 voltage regulating circuits regulate a source electric potential of the fifth MOS transistor and a source electric potential of the sixth MOS transistor, making the level conversion of voltage amplitudes having a large difference easy and hence resolving the above problem.

According to another aspect of the present invention, there is provided a level shifter comprising a first MOS transistor of a first conductive type having a source that is connected to a first power source and a gate to which a first input signal is inputted, and a second MOS transistor of a conductive type that is similar to the first conductive type having a source that is connected to the first power source and a gate to which a second input signal that is an inverted signal of the first input signal is inputted.

Further, the level shifter has a third MOS transistor of a second conductive type, which is a conductive type that is different from the first conductive type, having a drain that is connected to the drain of the first MOS transistor and a gate that is connected the drain of the second MOS transistor, and a fourth MOS transistor of a conductive type that is similar to the second conductive type having a drain that is connected to the drain of the second MOS transistor and a gate that is connected to the drain of the first MOS transistor.

Still further, the level shifter has a first voltage regulating circuit that is connected between a source of the third transistor and a second power source, and a second voltage regulating circuit that is connected between a source of the fourth MOS transistor and the second power source.

This level shifter converts the first and second input signals of a first voltage amplitude to a signal of a second voltage amplitude to thereby output a signal from at least one of the drain of the first MOS transistor or the drain of the second MOS transistor. In the transient period of a level conversion operation, the 2 voltage regulating circuits regulate a source electric potential of the third MOS transistor and a source electric potential of the fourth MOS transistor, making the level conversion of voltage amplitudes having a large difference easy and hence resolving the above problem.

The above-mentioned voltage regulating circuits may have a MOS transistor that has a drain and a gate thereof connected.

In addition, the above-mentioned voltage regulating circuits may be circuits that have a resistor which contains a poly-silicon layer or a silicon layer doped with an impurity element.

Further, the above-mentioned voltage regulating circuits may be circuits that include a MOS transistor having a constant voltage applied to a gate thereof.

BRIEF DESCRIPTION OF THE DRAWINGS

The above and other objects and features of the present invention will be more apparent from the following description taken in conjunction with the accompanying drawings:

FIGS. 16A to 16C are cross-sectional views showing a process of manufacturing a TFT;

FIGS. 17A to 17C are cross-sectional views showing a process of manufacturing a TFT;

DETAILED DESCRIPTION OF THE PREFERRED EMBODIMENTS

Embodiment Modes of the present invention will be described hereinafter with reference to the drawings. Note that in order to simplify the comparison with the exemplified conventional level shifter, the same reference symbols are used for the transistors and the like corresponding to the respective components of the conventional example in the description of the Embodiment Modes in the following.

[Embodiment Mode 1]

Figure 1:
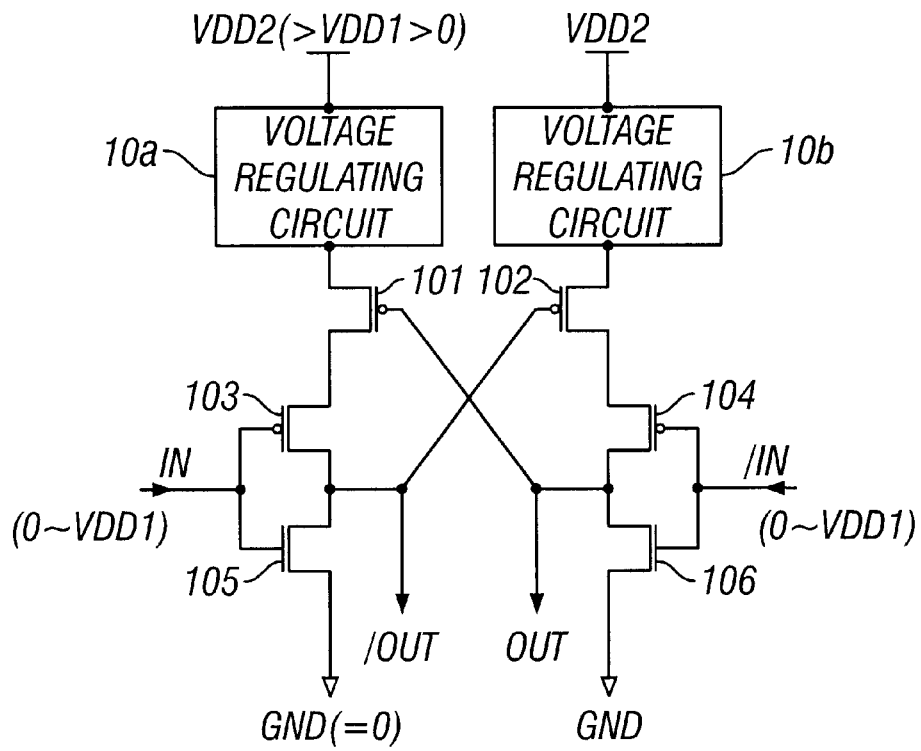
FIG. 1 is a view showing a level shifter according to Embodiment Mode 1 of the present invention.

A level shifter shown in FIG. 1 taking a structure which shifts a high electric potential side of a signal with a low electric potential side thereof fixed will be explained in Embodiment Mode 1. In the structure of this level shifter, first 2 elements or circuits (10a, 10b) for generating an electric potential difference (hereinafter referred to as voltage regulating circuit) when an electric current flows is connected to the power source VDD2 (>VDD1>0). The voltage regulating circuit 10 has at least 2 terminals, where the first terminal is connected to the power source VDD2 while the second terminal is connected to a source of the PMOST. In FIG. 1, the second terminal of the first voltage regulating circuit 10a is connected to the source of the PMOST 101, and the second terminal of the second voltage regulating circuit 10b is connected to the source of the PMOST 102, respectively. The drain of the PMOST 101 is connected to the source of the PMOST 103 and the drain of the PMOST 102 is connected to the source of the PMOST 104, respectively. In addition, the drain of the PMOST 103 is connected to the gate of the PMOST 102 and to the drain of the NMOST 105, and the drain of the PMOST 104 is connected to the gate of the PMOST 101 and to the drain of the NMOST 106. The source of the NMOST 105 and the source of the NMOST 106 are connected to the GND (0 V). Further, the input signal (IN) having the 0 to VDD1 voltage amplitude is fed to the gate of the PMOST 103 and that of NMOST 105, and the inverted input signal (/IN) of the input signal (IN), which has the same voltage amplitude, is fed to the gate of the PMOST 104 and to the gate of the NMOST 106, respectively, to thereby extract from the drain of the NMOST 106 an output signal (OUT) that has undergone a level conversion. It is to be noted that an inverted output signal (/OUT) of the above-mentioned output signal (OUT) can be extracted from the drain of the NMOST 105. The difference between this level shifter and that of the conventional one is that the 2 voltage regulating circuits 10a and 10b are connected to the power source VDD2 and between the sources of the PMOSTs 101 and 102.

Due to these voltage regulating circuits 10a and 10b, when the penetrating current that occurs during the transient period of the level conversion operation flows, the electric potential of the sources of the PMOST 101 and 102 is reduced to become smaller than the power source voltage VDD2. As a result, the level conversion operation of voltage amplitudes having a large difference can be readily performed. If a level conversion can be readily performed, then the level conversion operation also becomes speedy, resulting in reducing the flowing time of the penetrating current, that is, it is also effective in the reduction of the consumption power.

[Embodiment Mode 2]

Figure 2:
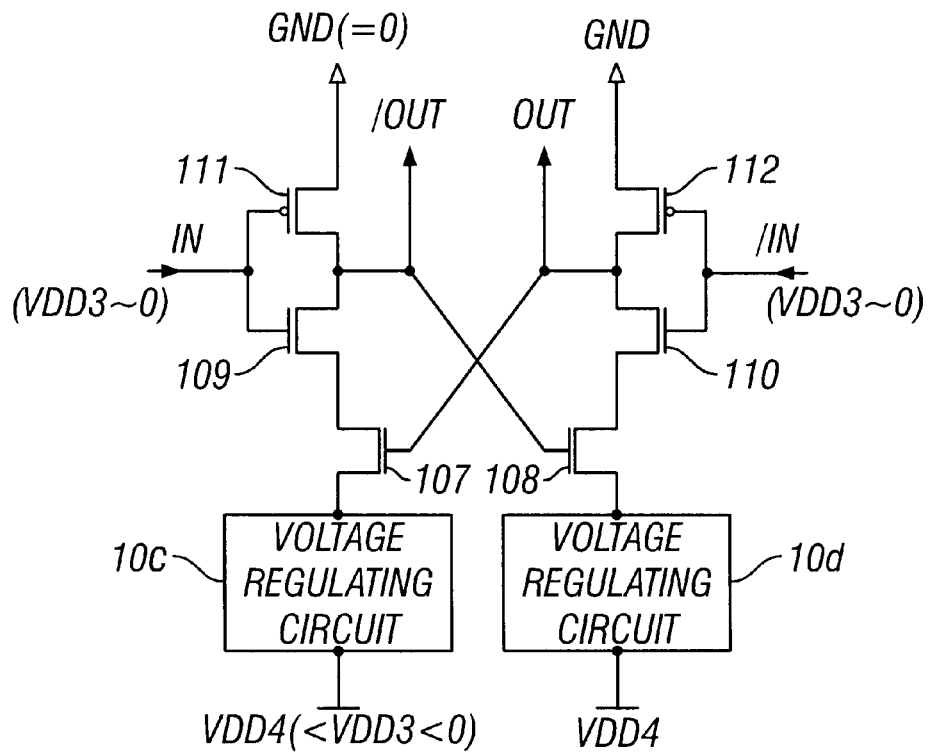
FIG. 2 is a view showing a level shifter according to Embodiment Mode 2 of the present invention.

A level shifter shown in FIG. 2 taking a structure which shifts the low electric potential side of a signal with the high electric potential side thereof fixed will be explained in Embodiment Mode 2. In the structure of this level shifter, similar to Embodiment Mode 1, first terminals of 2 voltage regulating circuits 10c and 10d are first connected to the power source VDD4 (<VDD3<0). The second terminal of the first voltage regulating circuit 10c is connected to the source of the NMOST 107 and the second terminal of the second voltage regulating circuit 10d is connected to the source of the NMOST 108, respectively. The drain of the NMOST 107 is connected to the source of the NMOST 109 and the drain of the NMOST 108 is connected to the source of the NMOST 110, respectively. In addition, the drain of the NMOST 109 is connected to the gate of the NMOST 108 and to the drain of the PMOST 111, and drain of the NMOST 110 is connected to the gate of the NMOST 107 and to the drain of the PMOST 112. The source of the PMOST 111 and the source of the PMOST 112 are connected to the GND (0 V). Further, the input signal (IN) having the VDD3 to 0 voltage amplitude is fed to the gate of the NMOST 109 and that of PMOST 111, and the inverted input signal (/IN) of the input signal (IN), which has the same voltage amplitude, is fed to the gate of the NMOST 110 and to the gate of the PMOST 112, respectively, to thereby extract from the drain of the PMOST 112 an output signal (OUT) that has undergone a level conversion. It is to be noted that an inverted output signal (/OUT) of the above-mentioned output signal (OUT) can be extracted from the drain of the PMOST 111. The difference between this level shifter and that of the conventional one is that the 2 voltage regulating circuits 10c and 10d are connected to the power source VDD4 and between the sources of the NMOSTs 107 and 108.

Due to these voltage regulating circuits 10c and 10d, when the penetrating current that occurs during the transient period of the level conversion operation flows, the electric potential of the sources of the NMOSTs 107 and 108 is raised to become larger than the power source VDD4. As a result, the level conversion operation of voltage amplitudes having a large difference can be readily performed. If a level conversion can be readily performed, then the level conversion operation also becomes speedy, resulting in reducing the flowing time of the penetrating current, that is, it is also effective in the reduction of the consumption power.

[Embodiment Mode 3]

Figure 3:
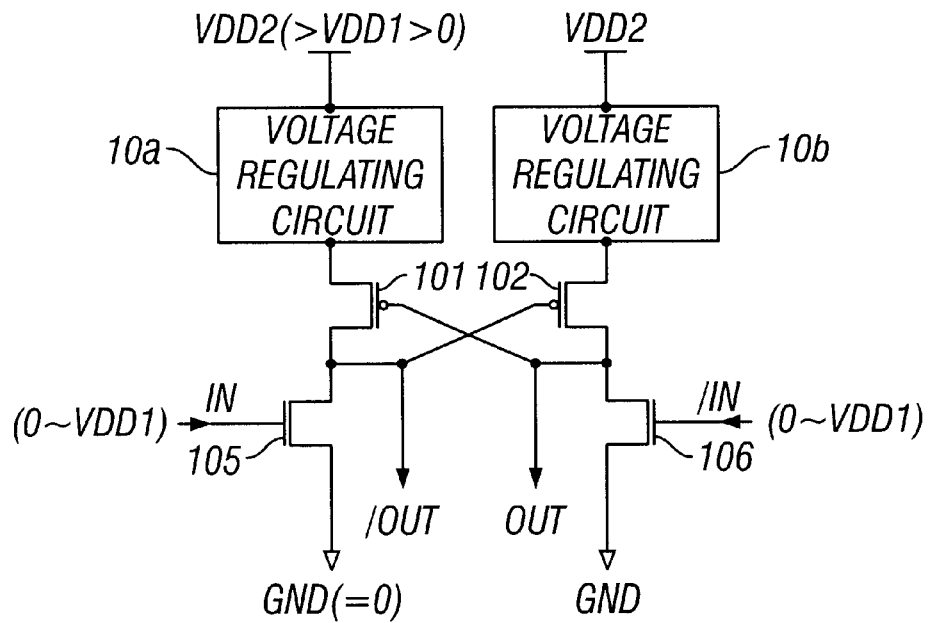
FIG. 3 is a view showing a level shifter according to Embodiment Mode 3 of the present invention.

A level shifter shown in FIG. 3 taking a structure which shifts the high electric potential side of a signal with the low electric potential side thereof fixed but different from Embodiment Mode 1 will be explained in Embodiment Mode 3. In the structure of this level shifter, similar to Embodiment Mode 1, the first terminals of the 2 voltage regulating circuits 10a and 10b are first connected to the power source VDD2 (>VDD1>0). The second terminal of the first voltage regulating circuit 10a is connected to the source of the PMOST 101 and the second terminal of the second voltage regulating circuit 10b is connected to the source of the PMOST 102, respectively. The drain of the PMOST 101 is connected to the gate of the PMOST 102 and to the drain of the NMOST 105, and the drain of the PMOST 102 is connected to the gate of the PMOST 101 and to the drain of the NMOST 106. The source of the NMOST 105 and the source of the NMOST 106 are connected to the GND (0 V). Further, the input signal (IN) having the 0 to VDD1 voltage amplitude is fed to the gate of the NMOST 105 and the inverted input signal (/IN) of the input signal (IN), which has the same voltage amplitude, is fed to the gate of the NMOST 106, respectively, to thereby extract from the drain of the NMOST 106 an output signal (OUT) that has undergone a level conversion. It is to be noted that an inverted output signal (/OUT) of the above-mentioned output signal (OUT) can be extracted from the drain of the NMOST 105. A structure in which the PMOSTs 103 and 104 in Embodiment Mode 1 are removed is the structure of the level shifter in Embodiment Mode 3. Note that the same reference symbols are used for the components corresponding to those of Embodiment Mode 1 in order to simplify the comparison between the 2 level shifters.

Due to these voltage regulating circuits 10a and 10b, when the penetrating current that occurs during the transient period of the level conversion operation flows the electric potential of the sources of the PMOST 101 and 102 is reduced to become smaller than the power source voltage VDD2. As a result, the level conversion operation of voltage amplitudes having a large difference can be readily performed. If a level conversion can be readily performed, then the level conversion operation also becomes speedy, resulting in reducing the flowing time of the penetrating current, that is, it is also effective in the reduction of the consumption power. Further, compared with Embodiment Mode 1, the number of transistors may be reduced.

[Embodiment Mode 4]

Figure 4:
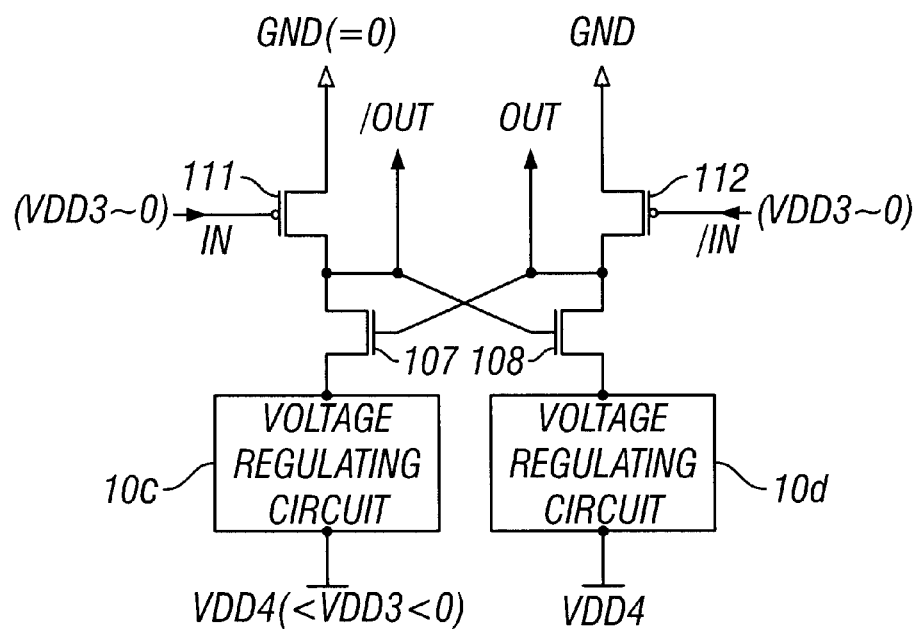
FIG. 4 is a view showing a level shifter according to Embodiment Mode 4 of the present invention.

A level shifter shown in FIG. 4 taking a structure which shifts the low electric potential side of a signal with the high electric potential side thereof fixed but different from Embodiment Mode 2 will be explained in Embodiment Mode 4. In the structure of this level shifter, similar to Embodiment Mode 2, the first terminals of 2 voltage regulating circuits 10c and 10d are first connected to the power source VDD4 (<VDD3<0). The second terminal of the first voltage regulating circuit 10c is connected to the source of the NMOST 107 and the second terminal of the second voltage regulating circuit 10d is connected to the source of the NMOST 108, respectively. The drain of the NMOST 107 is connected to the gate of the NMOST 108 and to the drain of the PMOST 111, and the drain of the NMOST 108 is connected to the gate of the NMOST 107 and to the drain of the PMOST 112. The source of the PMOST 111 and the source of the PMOST 112 are connected to the GND (0 V). Further, the input signal (IN) having the VDD3 to 0 voltage amplitude is fed to the gate of the PMOST 111 and the inverted input signal (/IN) of the input signal (IN), which has the same voltage amplitude, is fed to the gate of the PMOST 112, respectively, to thereby extract from the drain of the PMOST 112 an output signal (OUT) that has undergone a level conversion. It is to be noted that an inverted output signal (/OUT) of the above-mentioned output signal (OUT) can be extracted from the drain of the PMOST 111. A structure in which the NMOSTs 109 and 110 in Embodiment Mode 2 are removed is the structure of the level shifter in Embodiment Mode 4. Note that the same reference symbols are used for the components corresponding to those of Embodiment Mode 2 in order to simplify the comparison between the 2 level shifters. Due to these voltage regulating circuits 10c and 10d, when the penetrating current that occurs during the transient period of the level conversion operation flows, the electric potential of the sources of the NMOSTs 107 and 108 are raised to become larger than the power source voltage VDD4. As a result, the level conversion operation of voltage amplitudes having a large difference can be readily performed. If a level conversion can be readily performed, then the level conversion operation also becomes speedy, resulting in reducing the flowing time of the penetrating current, that is, it is also effective in reducing the consumption power. Further, compared with Embodiment Mode 2, the number of transistors may be reduced.

Embodiments

Hereinafter, embodiments of the present invention will be described with reference to the drawings.

[Embodiment 1]

Figure 23:
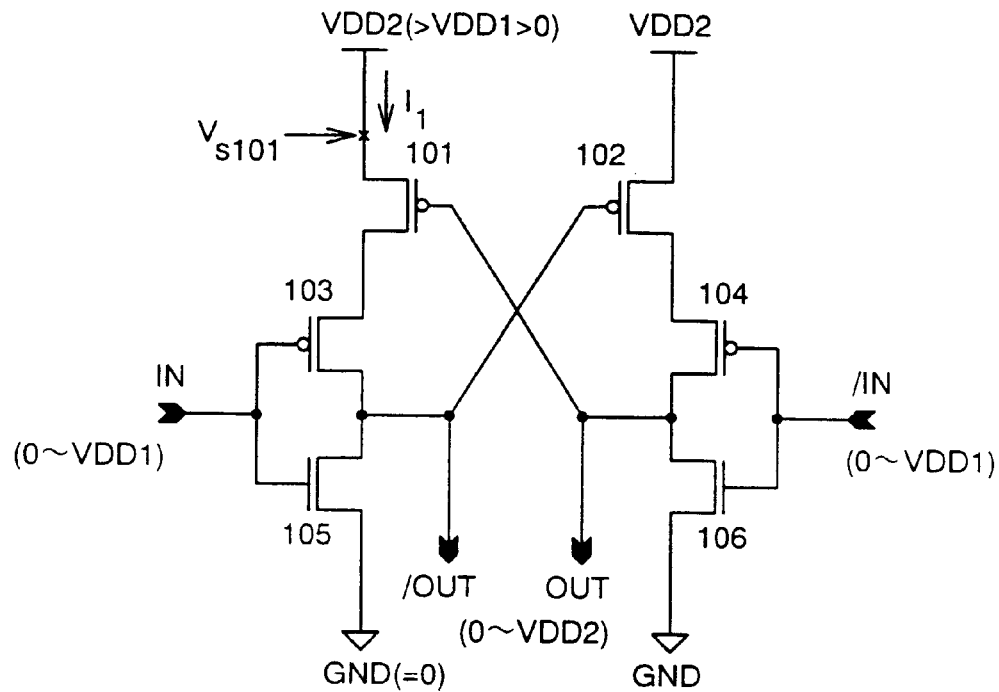
FIG. 23 is a view showing an exemplified conventional level shifter.

A level shifter shown in FIG. 5 which shifts the high electric potential side of a signal with the low electric potential side thereof fixed will be explained in Embodiment 1. It is to be noted that Embodiment 1 is an embodiment which specifies concrete examples of the voltage regulating circuits with respect to Embodiment Mode 1. In addition, the level shifter of Embodiment 1 is a reformed type of the conventional example shown in FIG. 23, and hence the same reference symbols are used for the transistors and the like corresponding to the respective parts. The structure of the level shifter of Embodiment 1 is as follows. A source of a PMOST 113 and a source of a PMOST 114 are each connected to the power source VDD2, and a gate and a drain of the PMOST 113 are connected to the source of the PMOST 101 while a gate and a drain of the PMOST 114 are connected to the source of the PMOST 102, respectively. The drain of the PMOST 101 is connected to the source of the PMOST 103 and the drain of the PMOST 102 is connected to the source of the PMOST 104, respectively. Further, the drain of the PMOST 103 is connected to the gate of the PMOST 102 and to the drain of the NMOST 105, and the drain of the PMOST 104 is connected to the gate of the PMOST 101 and to the drain of the NMOST 106. The source of the NMOST 105 and the source of the NMOST 106 are connected to the GND (0 V). Furthermore, the input signal (IN) having the 0 to VDD1 voltage amplitude is fed to the gate of the PMOST 103 and to the gate of the NMOST 105, and the inverted input signal (/IN) of the input signal (IN), which has the same voltage amplitude, is fed to the gate of the PMOST 104 and to the gate of the NMOST 106, respectively, to thereby extract from the drain of the NMOST 106 an output signal (OUT) that has undergone a level conversion. It is to be noted that an inverted output signal (/OUT) of the above-mentioned output signal (OUT) can be extracted from the drain of the NMOST 105. The difference between the level shifter of Embodiment 1 and that of the conventional example is the addition of the PMOSTs 113 and 114.

The operation of the level shifter of Embodiment 1 will be explained next. However, the transistors 101 to 106 perform the same role as those of the conventional example, and therefore the explanation thereof is simplified. How the operation has changed with the addition of the PMOSTs 113 and 114 will be mainly explained.

Figure 5:
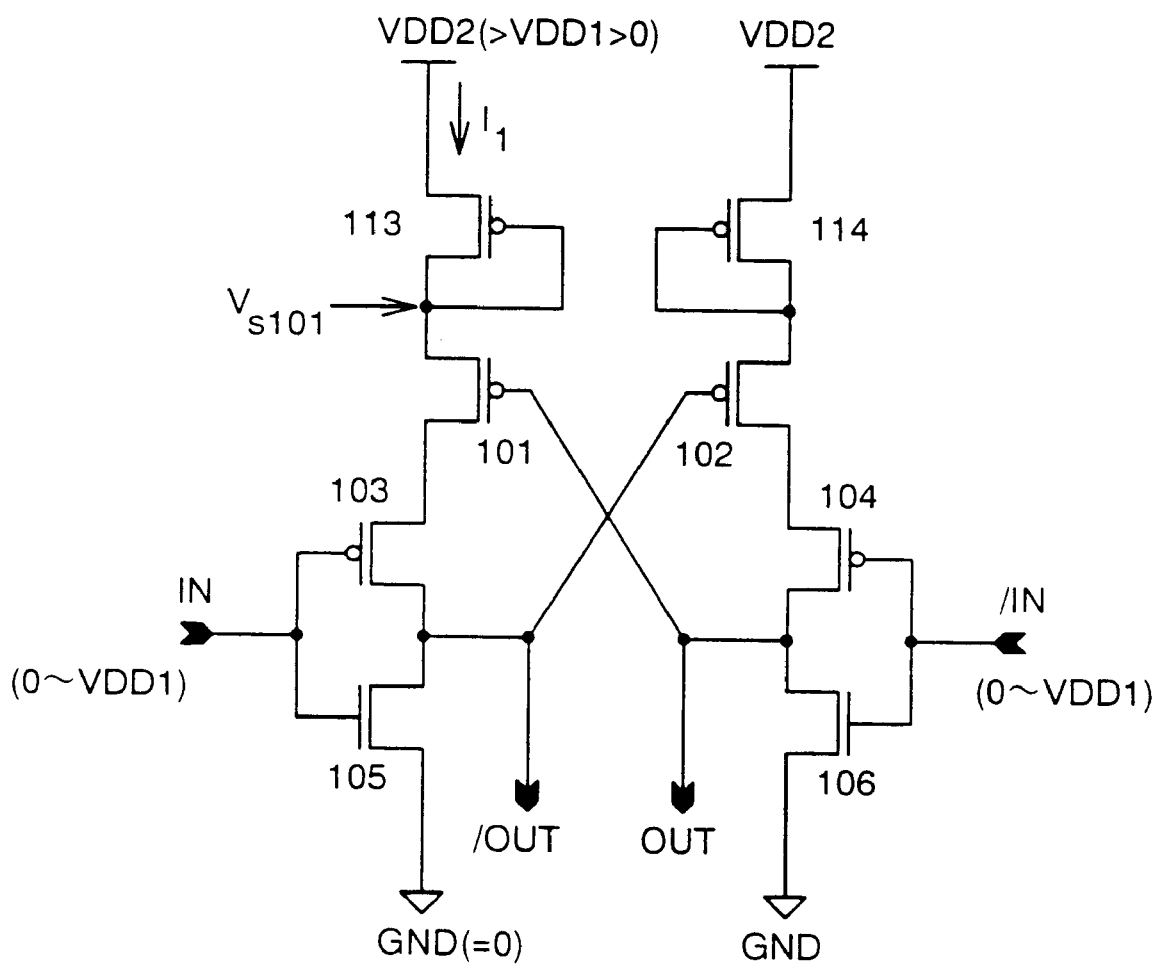
FIG. 5 is a view showing a level shifter according to Embodiment 1 of the present invention.

In the level shifter shown in FIG. 5, it is assumed for example that VDD1=5 V, VDD2=15 V, a threshold voltage of the PMOST 101 to 104 and 113 and 114 is −2 V, and a threshold voltage of the NMOST 105 and 106 is 2 V. First, consider that the electric potential of the input signal (IN) is "Lo" of 0 V, that is, a steady state under these conditions. At this point, the PMOSTs 101 and 103 are turned ON and the NMOST 105 is turned OFF, and therefore an electric potential from the power source VDD2 will be charged to the gate of the PMOST 102. However, because the PMOST 113 is constantly operating under a saturated region, under the steady state in which the charge is completed, the source electric potential of the PMOST 101 becomes 13 V, which is obtained by subtracting only the absolute value of the threshold voltage of the PMOST 113 from the electric potential 15 V of the VDD2. Therefore, the electric potential of the gate of the PMOST 102 (inverted output signal (/OUT)) also becomes the "Hi" of 13 V. On the other hand, the PMOST 102 is turned OFF and the NMOST 106 is turned ON, whereby the electric potential of the gate of the PMOST 101 (output signal (OUT)) is the "Lo" of 0 V. Thus, the source electric potential of the PMOST 102 becomes 13 V, similar to that of the PMOST 101.

Next, consider what happens when the electric potential of the input signal (IN) changes to "Hi" of 5 V from this state. At this point also, similarly as mentioned before, the PMOSTs 101, 103 and the NMOST 105 are turned ON immediately after the change of the input signal. Therefore, a penetrating current will try to flow between the source of the PMOST 113 that is connected to the power source VDD2 and the source of the NMOST 105 that is connected to the GND. However, because there is the PMOST 113 which operates in the saturated region, the voltage between the source and drain of the PMOST 113 further becomes larger (hereinafter the amount that becomes larger will be denoted by $\Delta_1$) to the amount of current that tries to flow, and the source electric potential of the PMOST 101 further becomes smaller to $(13-\Delta_1)$ V. Therefore, in the level shifter of the conventional example, the effect of reducing the power source voltage VDD2 from 15 V to $(13-\Delta_1)$ V can be similarly obtained. The $\Delta_1$ is increased as the penetrating current becomes larger and the source electric potential of the PMOST 101 also becomes smaller accordingly thereto. Thus, the PMOSTs 101 and 103 can be easily turned OFF, whereby the level shifter operates so that the penetrating current is also cut as a result. Alternatively, if the penetrating current is small, the current that is discharged from the gate of the PMOST 102 through the NMOST 105 will excel, whereby the PMOST 102 will be turned ON immediately. Thus, the gate of the PMOST 101 is charged to 13 V, resulting in turning OFF this transistor. Therefore, it has the effect of making the level conversion of the PMOST 113 easy.

Figure 6:
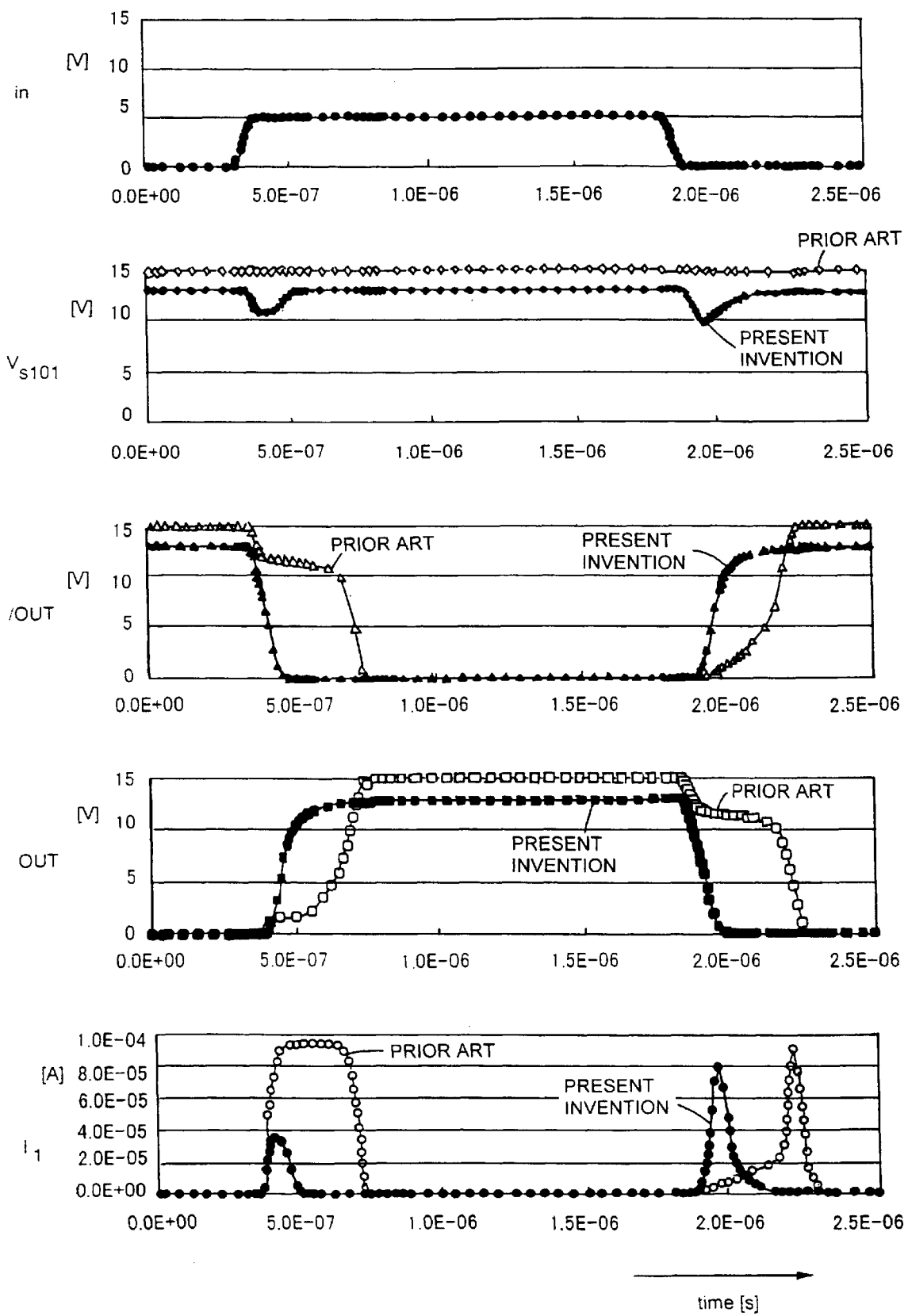
FIG. 6 are graphs showing simulation results of comparing an operation of the level shifter according to Embodiment 1 and an exemplified conventional level shifter.

The states thereof may be confirmed from the simulation results shown in FIG. 6. The results of the exemplified conventional level shifter denoted by outlined marks are also simultaneously shown in the figure. Note that the main parameters of the transistors used in the simulation are set as follows: the threshold voltage and mobility of all the PMOST are set to -2 V and 100 cm²/Vs, respectively; the threshold voltage and mobility of all the NMOST are set to 2 V and 100 cm²/Vs, respectively. In addition, a channel length of the transistors is set to 4 μm. Regarding channel widths thereof, the PMOST 101 to 104 are set to 10 μm, the NMOST 105 and 106 are set to 30 μm, and the PMOST 113 and 114 are set to 20 μm. Also note that $V_{S101}$ denotes the source electric potential of the PMOST 101, and $I_1$ denotes the current flowing between the source and drain of a PMOST 113, respectively. Thus it is apparent that in this level shifter as compared with the conventional example, the operating speed of the level conversion has been improved and that the penetrating current has been made smaller, whereby consumption power is lowered.

Figure 7A:
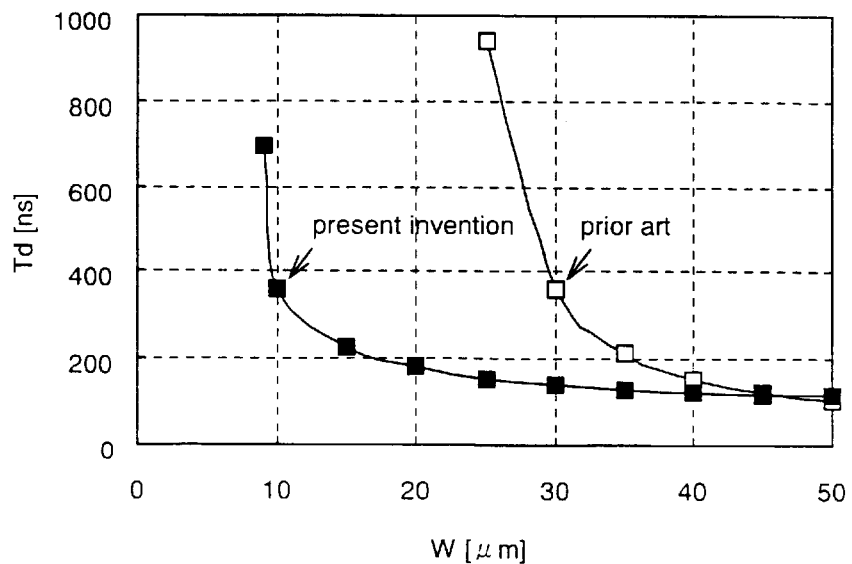
FIGS. 7A and 7B are graphs showing simulation results of comparing an operation delay time between the level shifter according to Embodiment 1 and an exemplified conventional level shifter.

In the case where the channel widths (W) of the NMOST 105 and 106 are changed (other conditions are the same as the above), a delay time (Td) from raising 50% of the input signal (IN) until the output signal (OUT) is raised to 7.5 V (set to 50% of 15 V) is obtained by simulation and shown in FIG. 7A. Compared with the conventional example, it is shown in the figure that even though the channel widths of the NMOST 105 and 106 have been reduced about 20 μm smaller, similar operations can be performed. Therefore, there is almost no increase in the area occupied by the circuit due to the additions of the PMOST 113 and 114.

Figure 7B:
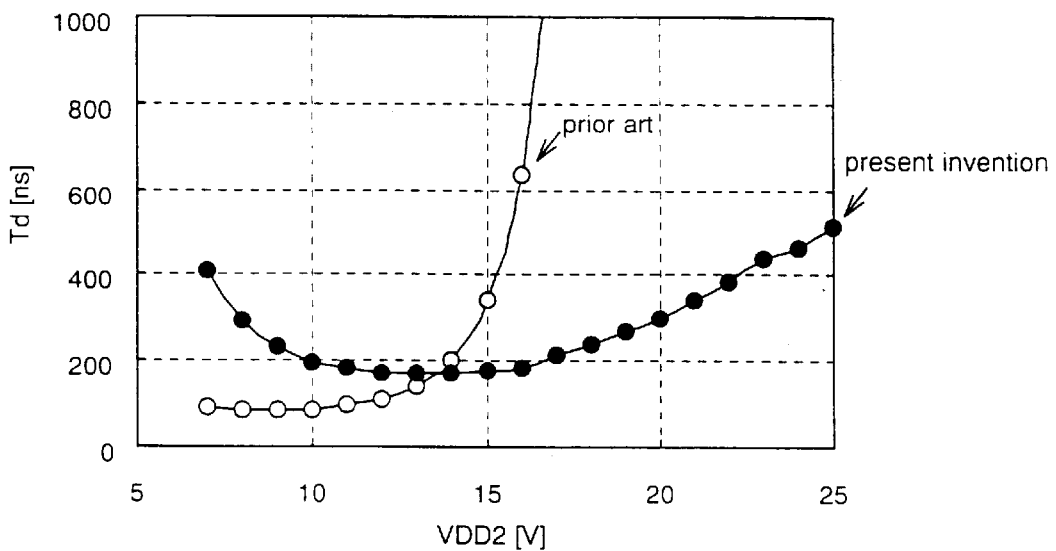

Shown in FIG. 7B is the simulation result of a delay time (Td) when the power source voltage VDD2 is changed. However, the delay time in this case denotes a delay time from the time the input signal (IN) has been raised 50% to the time the output (OUT) signal is raised to 50% of the power source voltage VDD2. The mobility and the threshold of the transistors employed in the simulation of this case is the same as the ones described above. Regarding the channel widths, the PMOST 101 to 104 are set to 10 μm, the NMOST 105 and 106 are set to 20 μm, and the PMOST 113 and 114 are set to 10 μm. The simulation results of the conventional example is also shown in FIG. 7B for comparison. However, in the conventional example, the channel widths of the NMOST 105 and 106 are set to 30 μm and only the portions of the PMOST 113 and 114 added in Embodiment 1 is increased in the occupied area under the same conditions. As is apparent from the figure, with respect to the exemplified conventional level shifter in which level conversion of voltage amplitudes having a large difference is difficult, the level shifter of Embodiment 1 may readily perform the level conversion. In addition, in the exemplified conventional level shifter, if the power source voltage VDD2 is increased, there is a tendency that the level conversion will suddenly fail. However, because the level shifter of the present invention is lenient in regards to this point, it can be commented that the level shifter of the present invention is also strong to the characteristic fluctuations of the transistors.

When the electric potential of the input signal (IN) changes from the "Hi" of 5 V to the "Lo" of 0 V, the respective roles of the PMOST 113 and 114, the PMOST 101 and 102, the PMOST 103 and 104, and the NMOST 105 and 106 are merely exchanged. Therefore, the above described operation is also acceptable if the respective transistors are replaced.

[Embodiment 2]

Figure 8:
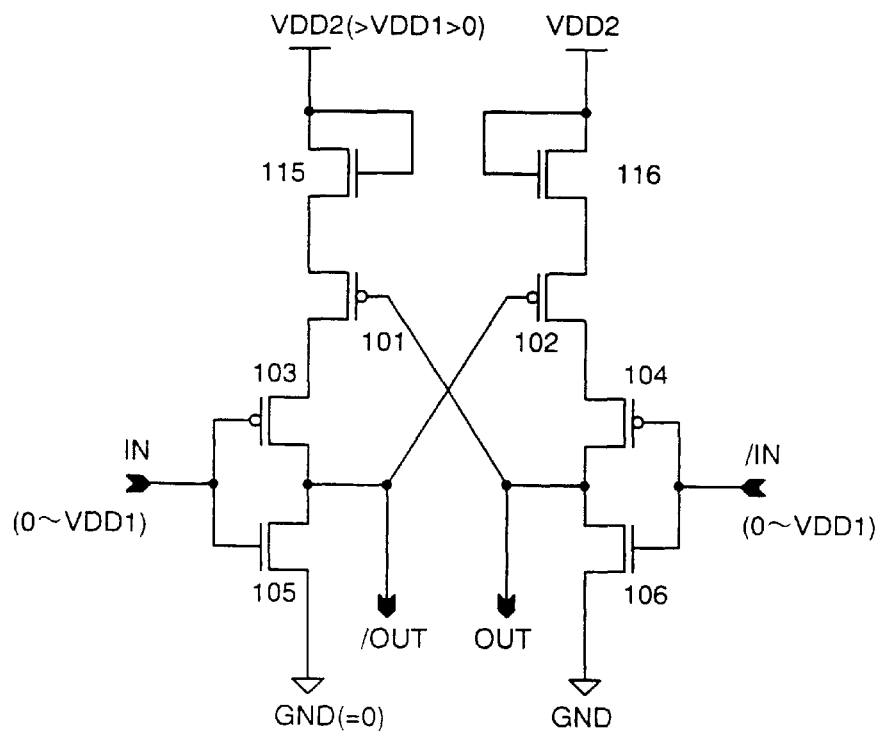
FIG. 8 is a view showing a level shifter according to Embodiment 2 of the present invention.

An example of a different level shifter which shifts the high electric potential side of a signal with the low electric potential side thereof fixed will also be explained in Embodiment 2. As shown in FIG. 8, the level shifter of Embodiment 2 is one in which the PMOST 113 and 114 in the level shifter of Embodiment 1 are replaced by NMOST 115 and 116, respectively, and the gates thereof are connected to the power source VDD2. It is to be noted that Embodiment 2 is also an embodiment which specifies concrete examples of the voltage regulating circuits with respect to Embodiment Mode 1. In addition, the level shifter of Embodiment 2 is a reformed type of the exemplified conventional level shifter shown in FIG. 23, and hence the same reference symbols are used for the transistors corresponding to the respective parts.

The structure of the level shifter of Embodiment 2 is as follows. A drain and a gate of the NMOST 115 and a drain and a gate of the NMOST 116 are each connected to the power source VDD2, and a source of the NMOST 115 is connected to the source of the PMOST 101 while a source of the NMOST 116 is connected to the source of the PMOST 102, respectively. The drain of the PMOST 101 is connected to the source of the PMOST 103 and the drain of the PMOST 102 is connected to the source of the PMOST 104, respectively. Further, the drain of the PMOST 103 is connected to the gate of the PMOST 102 and to the drain of the NMOST 105, and the drain of the PMOST 104 is connected to the gate of the PMOST 101 and to the drain of the NMOST 106. The source of the NMOST 105 and the source of the NMOST 106 are connected to the GND (0 V). Furthermore, the input signal (IN) having the 0 to VDD1 voltage amplitude is fed to the gate of the PMOST 103 and to the gate of the NMOST 105, and the inverted input signal (/IN) of the input signal (IN), which has the same voltage amplitude, is fed to the gate of the PMOST 104 and to the gate of the NMOST 106, respectively, to thereby extract from the drain of the NMOST 106 an output signal (OUT) that has undergone a level conversion. It is to be noted that an inverted output signal (/OUT) of the above-mentioned output signal (OUT) can be extracted from the drain of the NMOST 105. The difference between the level shifter of Embodiment 2 and that of the conventional example is the addition of the NMOSTs 115 and 116.

In the level shifter of Embodiment 2, although the roles of the PMOST 113 and 114 in Embodiment 1 are substituted by the NMOST 115 and 116 the operation thereof is basically the same as that of Embodiment 1. Therefore, the level shifter of Embodiment 2 converts a signal having the 0 to VDD1 voltage amplitude to a signal having a 0 to (VDD2−$V_{th1}$) voltage amplitude. Here, $V_{th1}$ denotes the threshold voltage of the NMOST 115 or 116.

Thus, similar to Embodiment 1, the level shifter of Embodiment 2 can easily perform a level conversion that has a large level difference and the operating speed thereof is improved. Further, the penetrating current is small and therefore has an effect in the reduction of consumption power. In addition, the level shifter of Embodiment 2 is strong in regards to the characteristic fluctuations of the transistors. In Embodiment 2, by manufacturing the transistors so that the threshold voltage of the NMOST is smaller than the absolute value of the threshold voltage of the PMOST, the level shifter of Embodiment 2 can have an adequate margin for turning OFF the PMOST of a logic circuit for input of the output signal in a next stage.

[Embodiment 3]

Figure 24:
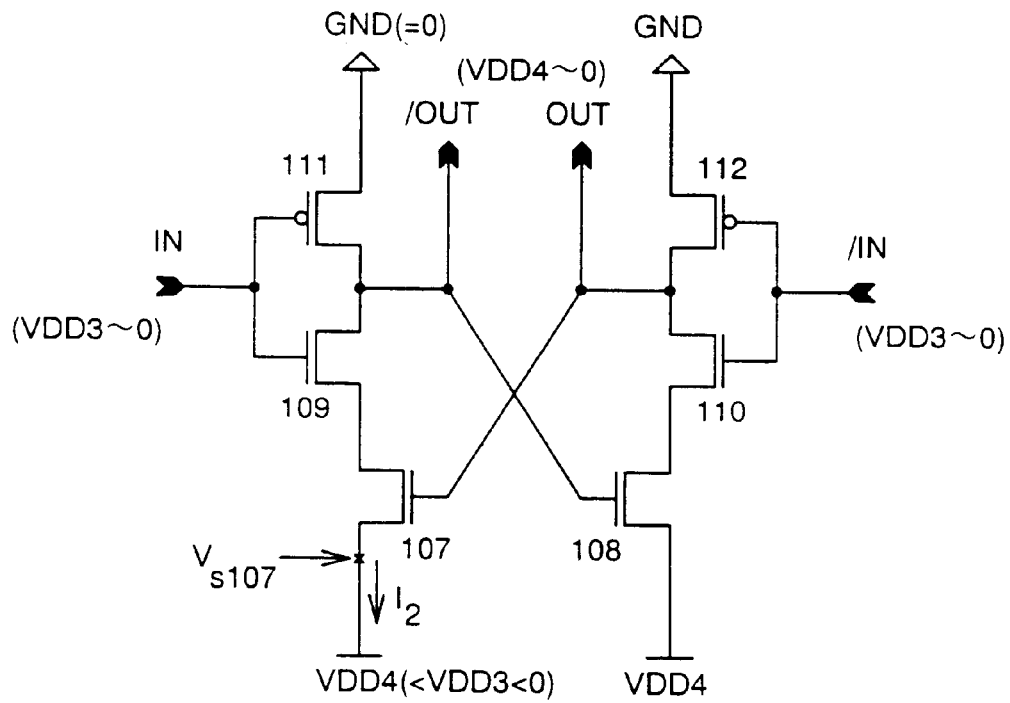
FIG. 24 is a view showing an exemplified conventional level shifter.

A level shifter shown in FIG. 9 which shifts the low electric potential side of a signal with the high electric potential side thereof fixed will be explained in Embodiment 3. It is to be noted that Embodiment 3 is an embodiment which specifies concrete examples of the voltage regulating circuits with respect to Embodiment Mode 2. In addition, the level shifter of Embodiment 3 is a reformed type of the exemplified conventional level shifter shown in FIG. 24, and hence the same reference symbols are used for denoting the transistors and the like corresponding to the respective parts.

The structure of the level shifter of Embodiment 3 is as follows. A source of an NMOST 117 and a source of an NMOST 118 are each connected to the power source VDD4, and a gate and a drain of the NMOST 117 are connected to the source of the NMOST 107 while a gate and a drain of the NMOST 118 are connected to the source of the NMOST 108, respectively. The drain of the NMOST 107 is connected the source of the NMOST 109 and the drain of the NMOST 108 is connected to the source of the NMOST 110, respectively. Further, the drain of the NMOST 109 is connected to the gate of the NMOST 108 and to the drain of the PMOST 111, and the drain of the NMOST 110 is connected to the gate of the NMOST 107 and to the drain of the PMOST 112. The source of the PMOST 111 and the source of the PMOST 112 are connected to the GND (0 V). Furthermore, the input signal (IN) having the VDD3 to 0 voltage amplitude is fed to the gate of the NMOST 109 and to the gate of the PMOST 111, and the inverted input signal (/IN) of the input signal (IN), which has the same voltage amplitude, is fed to the gate of the NMOST 110 and to the gate of the PMOST 112, respectively, to thereby extract from the drain of the PMOST 112 an output signal (OUT) that has undergone a level conversion. It is to be noted that an inverted output signal (/OUT) of the above-mentioned output signal (OUT) can be extracted from the drain of the PMOST 111. The difference between the level shifter of Embodiment 3 and that of the conventional example is the addition of the NMOSTs 117 and 118.

The operation of the level shifter of Embodiment 3 will be explained next. However, the transistors 107 to 112 perform the same role as those of the conventional example, and therefore the explanation thereof is simplified. How the operation has changed with the addition of the PMOSTs 117 and 118 will be mainly explained.

Figure 9:
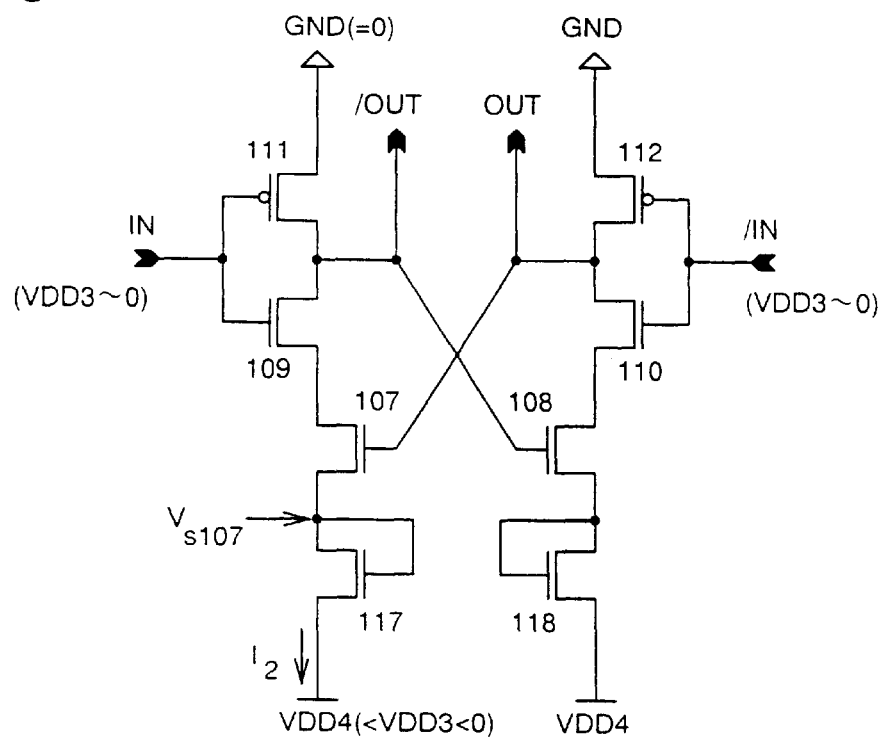
FIG. 9 is a view showing a level shifter according to Embodiment 3 of the present invention.

In the level shifter shown in FIG. 9, it is assumed for example that VDD3=−5 V, VDD4=−15 V, a threshold voltage of the NMOST 107 to 110 and 117 and 118 is 2 V, and a threshold voltage of the PMOST 111 and 112 is −2 V. First, consider that the electric potential of the input signal (IN) is "Hi" of 0 V, that is, a steady state under these conditions. At this point, the NMOSTs 107 and 109 are turned ON and the PMOST 111 is turned OFF, and therefore a charge stored in the gate of the NMOST 108 is discharged to the power source VDD4. However, because the NMOST 117 is constantly operating under a saturated region, under the steady state in which the discharge is completed, the source electric potential of the NMOST 107 becomes −13 V, which is obtained by adding only the threshold voltage of the NMOST 117 to the electric potential −15 V of the power source voltage VDD4. Therefore, the electric potential of the gate of the NMOST 108 (inverted output signal (/OUT) also becomes the "Lo" of −13 V. On the other hand, the NMOST 103 is turned OFF and the PMOST 112 is turned ON, whereby the electric potential of the gate of the NMOST 107 (output signal (OUT)) is the "Hi" of 0 V. Thus, the source electric potential of the NMOST 108 becomes −13 V, similar to that of the NMOST 107.

Next, consider what happens when the electric potential of the input signal (IN) changes to "Lo" of −5 V from this state. At this point also, similarly as mentioned before, the NMOSTs 107, 109 and the PMOST 111 are turned ON immediately after the change of the input signal. Therefore, a penetrating current will try to flow between the source of the NMOST 111 that is connected to the power source VDD4 and the source of the PMOST 111 that is connected to the GND. However, because there is the NMOST 117 which operates in the saturated region, the voltage between the source and drain of the NMOST 117 further becomes larger (hereinafter the amount that becomes larger will be denoted by $\Delta_2$) to the amount of current that tries to flow, and the source electric potential of the NMOST 107 further becomes smaller to −(13−$\Delta_2$). Therefore, in the exemplified conventional level shifter, the effect of increasing the power source voltage VDD4 from −15 V to −(13−$\Delta_2$) V can be similarly obtained. The $\Delta_2$ is increased as the penetrating current becomes larger and the source electric potential of the NMOST 107 also becomes larger accordingly thereto. Thus, the NMOSTs 107 and 109 can be easily turned OFF, whereby the level shifter operates so that the penetrating current is also cut as a result. Alternatively, if the penetrating current is small, the current that is charged to the Gate of the NMOST 108 through the PMOST 111 will excel, whereby the NMOST 108 will be turned ON immediately. Thus, the gate of the NMOST 107 is charged to −13 V, resulting in turning OFF this transistor. Therefore, it has the effect of making the level conversion of the NMOST 117 easy.

Figure 10:
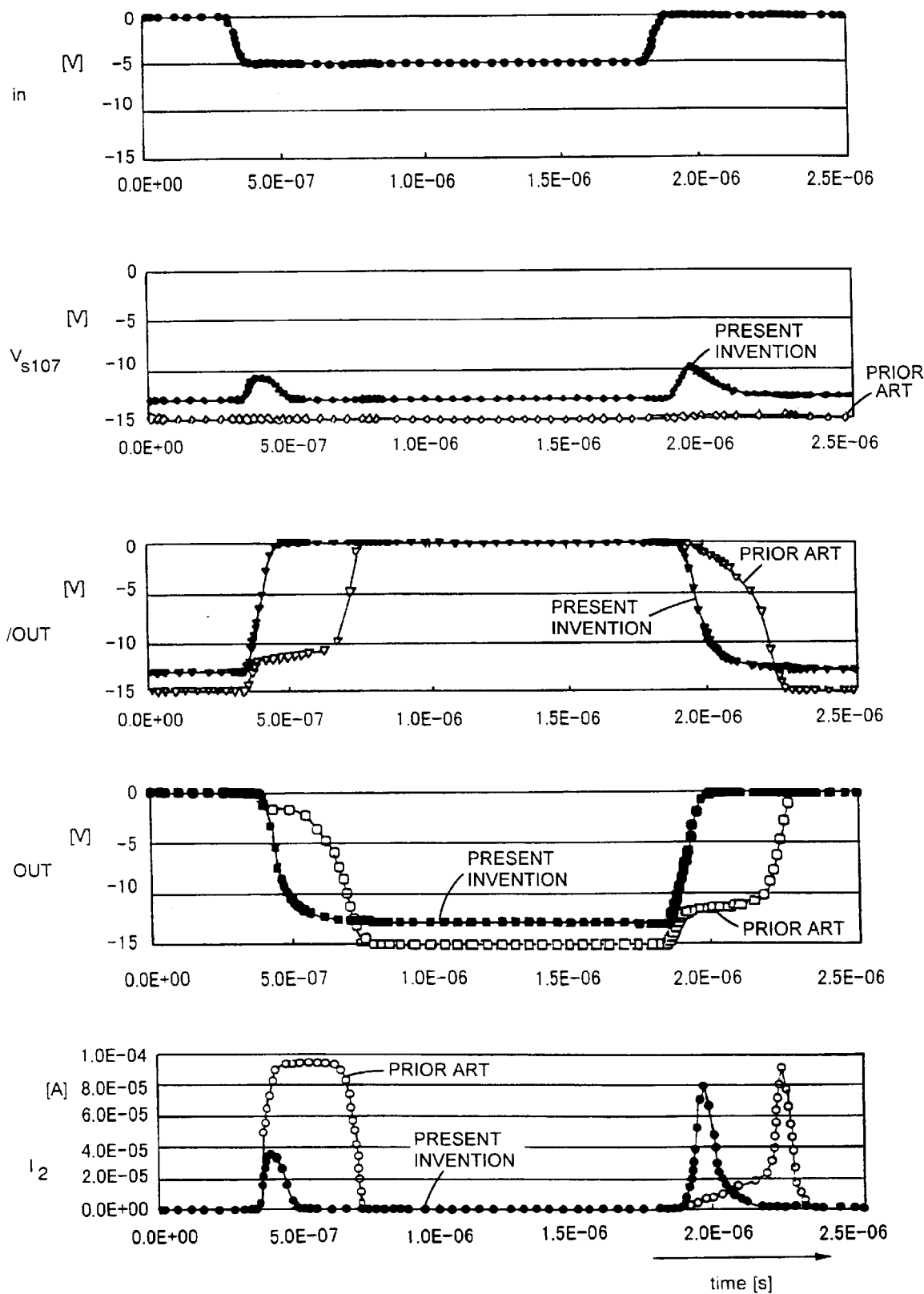
FIG. 10 are graphs showing simulation results of comparing an operation of the level shifter according to Embodiment 3 and an exemplified conventional level shifter.

The states thereof may be confirmed from the simulation results shown in FIG. 10. The results of the exemplified conventional level shifter denoted by outlined marks are also simultaneously shown in the figure. Note that the main parameters of the transistors used in the simulation are set as follows: the threshold voltage and mobility of all the PMOST are set to −2 V and 100 cm²/Vs, respectively; the threshold voltage and mobility of all the NMOST are set to 2 V and 100 cm²/Vs, respectively. In addition, all the channel lengths of the transistors are set to 4 μm. Regarding the channel width thereof, the NMOSTs 107 to 110 are set to 10 μm, the PMOSTs 111 and 112 are set to 30 μm, and the NMOSTs 117 and 118 are set to 20 μm. Also note that $V_{S107}$ denotes the source electric potential of the NMOST 107 and $I_2$ denotes the current flowing between the source and drain of an NMOST 117, respectively. Thus, it is apparent that in this level shifter as compared with the conventional example, the operating speed of the level conversion has been improved, and that the penetrating current has been made smaller whereby consumption power is lowered. Further, similar to the level shifter of Embodiment 1, the level shifter of Embodiment 3 is also strong in regards to the characteristic fluctuations of the transistors.

When the electric potential of the input signal (IN) changes from the "Lo" of −5 V to the "Hi" of 0 V, the respective roles of the NMOSTs 117 and 118, the NMOSTs 107 and 108, the NMOSTs 109 and 110, and the PMOSTs 111 and 112 are merely changed. Therefore, the above described operation is also acceptable if the respective transistors are replaced.

[Embodiment 4]

Figure 11:
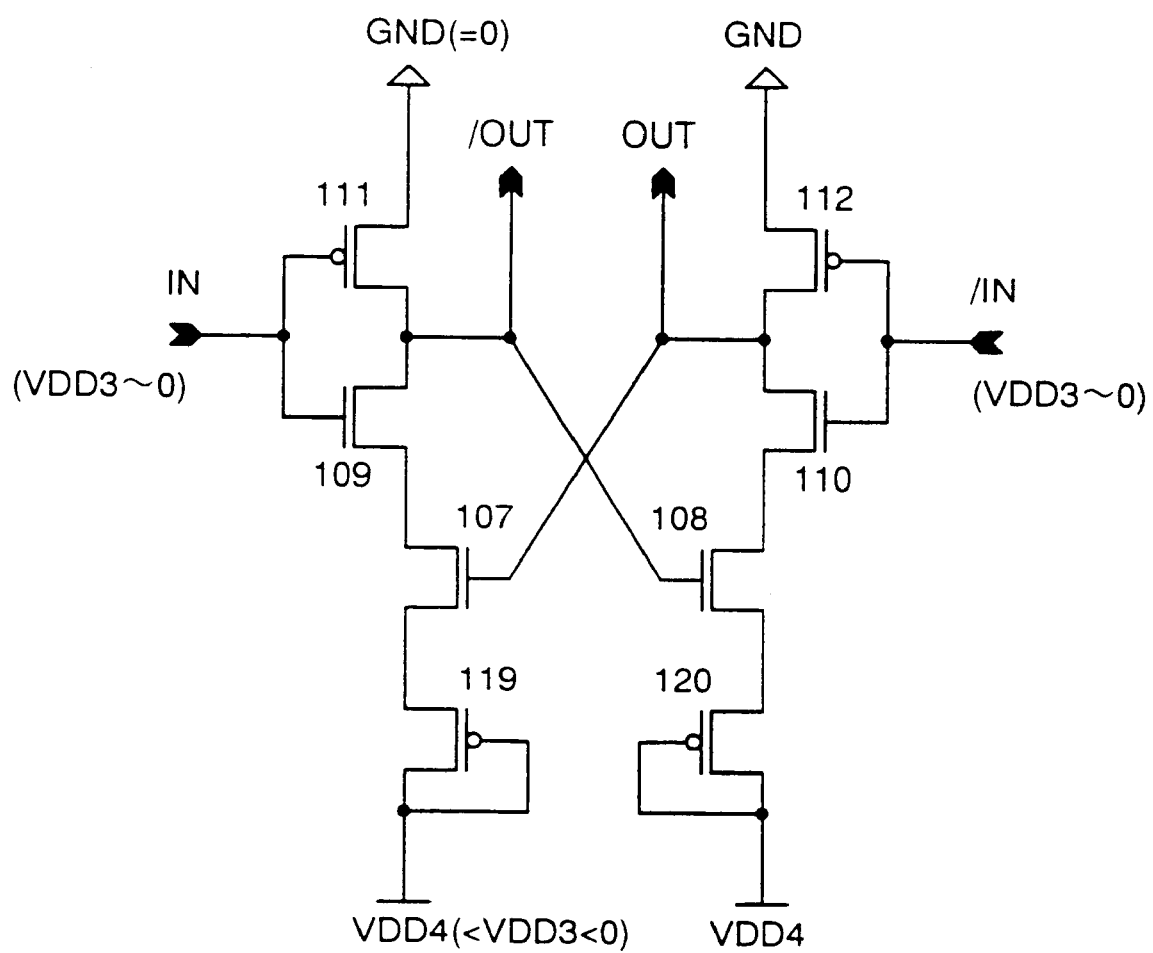
FIG. 11 is a view showing a level shifter according to Embodiment 4 of the present invention.

An example of a different level shifter which shifts the low electric potential side of a signal with the high electric potential side thereof fixed will also be explained in Embodiment 4. As shown in FIG. 11, the level shifter of Embodiment 4 is one in which the NMOST 117 and 118 in the level shifter of Embodiment 3 are replaced by PMOST 119 and 120, respectively, and the gates thereof are connected to the power source VDD4. It is to be noted that Embodiment 4 is also an embodiment which specifies concrete examples of the voltage regulating circuits with respect to Embodiment Mode 2. In addition, the level shifter of Embodiment 4 is a reformed type of the exemplified conventional level shifter shown in FIG. 24, and hence the same reference symbols are used for the transistors corresponding to the respective parts.

The structure of the level shifter of Embodiment 4 is as follows. A drain and a gate of the PMOST 119 and a drain and a gate of the PMOST 120 are each connected to the power source VDD4, and a source of the PMOST 119 is connected to the source of the NMOST 107 while a source of the PMOST 120 is connected to the source of the NMOST 108, respectively. The drain of the NMOST 107 is connected to the source of the NMOST 109 and the drain of the NMOST 108 is connected to the source of the NMOST 110, respectively. Further, the drain of the NMOST 109 is connected to the gate of the NMOST 108 and to the drain of the PMOST 111, and the drain of the NMOST 110 is connected to the gate of the NMOST 107 and to the drain of the PMOST 112. The source of the PMOST 111 and the source of the PMOST 112 are each connected to the GND (0 V). Furthermore, the input signal (IN) having the VDD3 to 0 voltage amplitude is fed to the gate of the NMOST 109 and to the gate of the PMOST 111, and the inverted input signal (/IN) of the input signal (IN), which has the same voltage amplitude, is fed to the gate of the NMOST 110 and to the gate of the PMOST 112, respectively, to thereby extract from the drain of the PMOST 112 an output signal (OUT) that has undergone a level conversion. It is to be noted that an inverted-output signal (/OUT) of the above-mentioned output signal (OUT) can be extracted from the drain of the PMOST 111. The difference between the level shifter of Embodiment 4 and that of the conventional example is the addition of the PMOST 119 and 120. In the level shifter of Embodiment 4, although the roles of the NMOST 117 and 118 in Embodiment 3 are substituted by the PMOST 119 and 120, the operation thereof is basically the same as that of Embodiment 3. Therefore, the level shifter of Embodiment 4 converts a signal having the VDD3 to 0 voltage amplitude to a signal having a (VDD4−$V_{th2}$) to 0 voltage amplitude. Here, $V_{th2}$ denotes the threshold voltage of the PMOST 119 or 120.

Thus, similar to Embodiment 3, the level shifter of Embodiment 4 can easily perform a level conversion that has a large level difference compared to a conventional example and the operating speed thereof is improved. Further, the penetrating current is small and therefore has an effect in the reduction of consumption power. In addition, the level shifter of Embodiment 4 is strong in regards to the characteristic fluctuations of the transistors. In Embodiment 4, by manufacturing the transistors so that the absolute value of the threshold voltage of the PMOST is smaller than the threshold voltage of the NMOST, the level shifter of Embodiment 4 can have an adequate margin for turning OFF the NMOST of a logic circuit for input of the output signal in a next stage.

[Embodiment 5]

Figure 12:
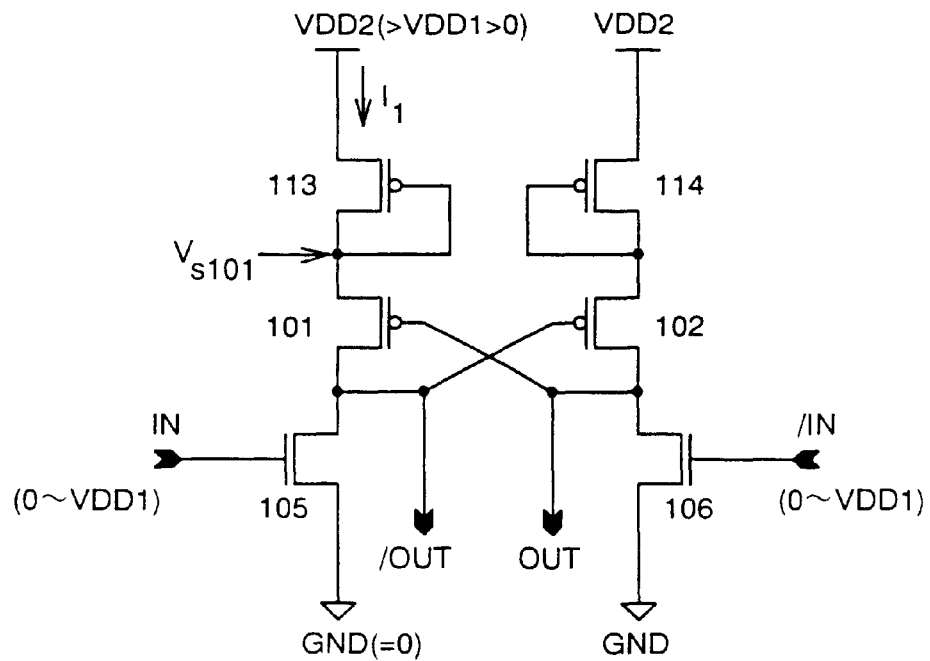
FIG. 12 is a view showing a level shifter according to Embodiment 5 of the present invention.

A level shifter shown in FIG. 12 which shifts the high electric potential side of a signal with the low electric potential side thereof fixed will be explained in Embodiment 5. It is to be noted that Embodiment 5 is an embodiment which specifies concrete examples of the voltage regulating circuits with respect to Embodiment Mode 3. In addition, the level shifter of Embodiment 5 is a reformed type of the level shifter of Embodiment 1 illustrated in FIG. 5, and hence the same reference symbols are used for the transistors corresponding to the respective parts. The structure of the level shifter of Embodiment 5 is as follows. The source of the PMOST 113 and the source of the PMOST 114 are each connected to the power source VDD2, and the gate and the drain of the PMOST 113 are connected to the source of the PMOST 101 while the gate and the drain of the PMOST 114 are connected to the source of the PMOST 102, respectively. The drain of the PMOST 101 is connected to the gate of the PMOST 102 and to the drain of the NMOST 105, and the drain of the PMOST 102 is connected to the gate of the PMOST 101 and to the drain of the NMOST 106, respectively. The source of the NMOST 105 and the source of the NMOST 106 are connected to the GND (0 V). Furthermore, the input signal (IN) having the 0 to VDD1 voltage amplitude is fed to the gate of the NMOST 105, and the inverted input signal (/IN) of the input signal (IN) which has the same voltage amplitude, is fed to the gate of the NMOST 106, respectively, to thereby extract from the drain of the NMOST 106 an output signal (OUT) that has undergone a level conversion. It is to be noted that an inverted output signal (/OUT) of the above-mentioned output signal (OUT) can be extracted from the drain of the NMOST 105. A structure in which the PMOST 103 and 104 in Embodiment 1 are removed is the structure of the level shifter of Embodiment 5 and the operation thereof is basically the same as that of Embodiment 1. There is no problem in removing the PMOST 103 and 104 because they do not fulfill their original roles in the level conversion of a large level difference. The level shifter of Embodiment 5 converts a signal having the 0 to VDD1 voltage amplitude to a signal having a 0 to (VDD2−$V_{th3}$) voltage amplitude. Here, $V_{th3}$ denotes the threshold voltage of the PMOST 113 or 114.

Thus, similar to Embodiment 1, the level shifter of Embodiment 5 as compared with the conventional example can easily perform a level conversion that has a large level difference and the operating speed thereof is improved. Further, the penetrating current is small and therefore has an effect in the reduction of consumption power. In addition, the level shifter of Embodiment 5 is strong in regards to the characteristic fluctuations of the transistors. Note that the level shifter of Embodiment 5 is composed of the same number of transistors as that of the conventional example. Therefore, the area occupied by the circuit can be made smaller as long as level shifters having operational characteristics of about the same level is used.

[Embodiment 6]

Figure 13:
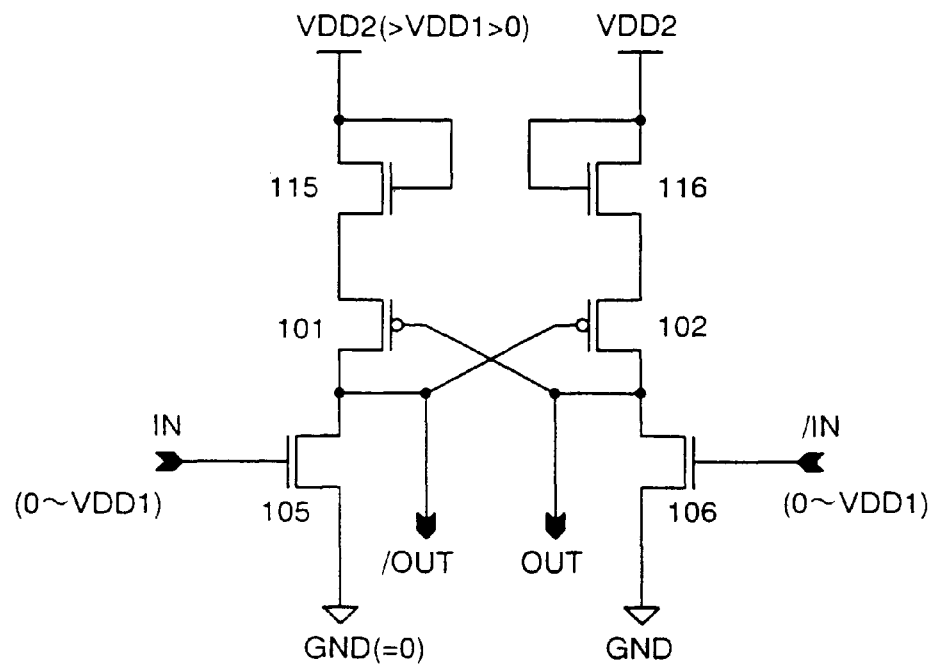
FIG. 13 is a view showing a level shifter according to Embodiment 6 of the present invention.

An example of a different level shifter which shifts the high electric potential side of a signal with the low electric potential side thereof fixed will also be explained in Embodiment 6. As shown in FIG. 13, the level shifter to Embodiment 6 is one in which the PMOST 113 and 114 in the level shifter of Embodiment 5 illustrated in FIG. 12 are replaced by NMOST 115 and 116, respectively, and the gates thereof are connected to the power source VDD2. It is to be noted that Embodiment 6 is also an embodiment which specifies concrete examples of the voltage regulating circuits with respect to Embodiment Mode 3. In addition, the level shifter of Embodiment 6 is a reformed type of the level shifter of Embodiment 2 shown in FIG. 8, and hence the same reference symbols are used for denoting the transistors and the like corresponding to the respective parts.

The structure of the level shifter of Embodiment 6 is as follows. The drain and the gate of the NMOST 115 and the drain and the gate of the NMOST 116 are each connected to the power source VDD2, and the source of the NMOST 115 is connected to the source of the PMOST 101 while the source of the NMOST 116 is connected to the source of the PMOST 102, respectively. The drain of the PMOST 101 is connected to the gate of the PMOST 102 and to the drain of the NMOST 105, and the drain of the PMOST 102 is connected to the gate of the PMOST 101 and to the drain of the NMOST 106. The source of the NMOST 105 and the source of the NMOST 106 are connected to the GND (0 V). Furthermore, the input signal (IN) having the 0 to VDD1 voltage amplitude is fed to the gate of the NMOST 105, and the inverted input signal (/IN) of the input signal (IN), which has the same voltage amplitude, is fed to the gate of the NMOST 106, respectively, to thereby extract from the drain of the NMOST 106 an output signal (OUT) that has undergone a level conversion. It is to be noted that an inverted output signal (/OUT) of the above-mentioned output signal (OUT) can be extracted from the drain of the NMOST 105. A structure in which the PMOST 103 and 104 in Embodiment 2 are removed is the structure of the level shifter of Embodiment 6, and the operation thereof is basically the same as that of Embodiment 2. There is no problem in removing the PMOST 103 and 104 because they do not fulfill their original roles in the level conversion of a large level difference. The level shifter of Embodiment 6 converts a signal having the 0 to VDD1 voltage amplitude to a signal having a 0 to (VDD2-$V_{th1}$) voltage amplitude. Here, $V_{th1}$ denotes the threshold voltage of the PMOST 115 or 116.

Thus, similar to Embodiment 2, the level shifter of Embodiment 6 as compared with the conventional example can easily perform a level conversion that has a large level difference and the operating speed thereof is improved. Further, the penetrating current is small and therefore has an effect in the reduction of consumption power. In addition, the level shifter of Embodiment 6 is strong in regards to the characteristic fluctuations of the transistors. In Embodiment 6, by manufacturing the transistors so that the threshold voltage of the NMOST is smaller than the absolute value of the threshold voltage of the PMOST, the level shifter of Embodiment 6 can have an adequate margin for turning OFF the PMOST of a logic circuit for input of the output signal in a next stage. Note that the level shifter of Embodiment 6 is composed of the same number of transistors as that of the conventional example. Therefore, the area occupied by the circuit can be made smaller as long as level shifters having operational characteristics of about the same level is used.

[Embodiment 7]

Figure 14:
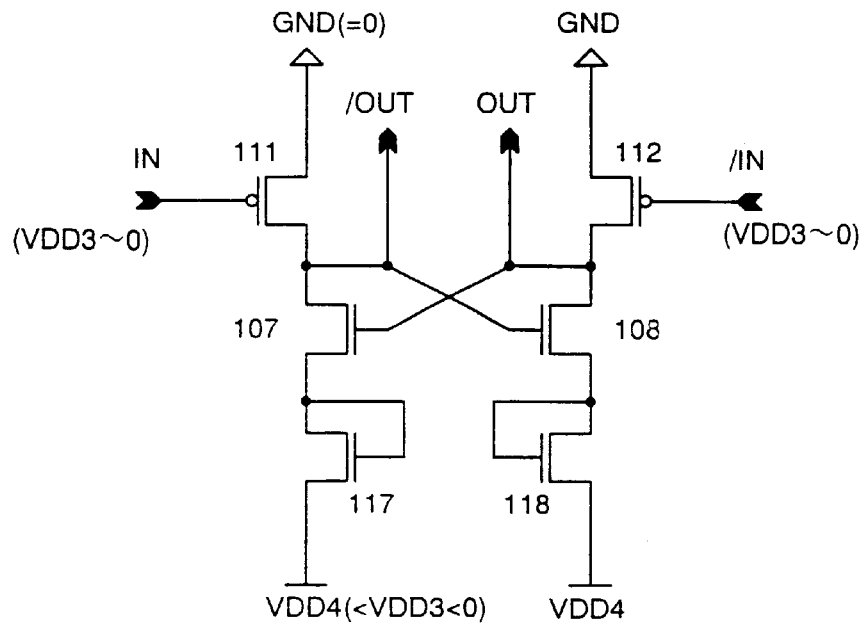
FIG. 14 is a view showing a level shifter according to Embodiment 7 of the present invention.

A level shifter shown in FIG. 14 which shifts the low electric potential side of a signal with the high electric potential side thereof fixed will be explained in Embodiment 7. It is to be noted that Embodiment 7 is an embodiment which specifies concrete examples of the voltage regulating circuits with respect to Embodiment Mode 4. In addition, the level shifter of Embodiment 7 is a reformed type of the level shifter of Embodiment 3 shown in FIG. 9, and hence the same reference symbols are used for denoting the transistors and the like corresponding to the respective parts, The structure of the level shifter of Embodiment 7 is as follows. The source of the NMOST 117 and the source of the NMOST 118 are each connected to the power source VDD4, and the gate and the drain of the NMOST 117 are connected to the source of the NMOST 107 while the gate and the drain of the NMOST 118 are connected to the source of the NMOST 108, respectively. The drain of the NMOST 107 is connected to the gate of the NMOST 108 and to the drain of the PMOST 111, and the drain of the NMOST 108 is connected to the gate of the NMOST 107 and to the drain of the PMOST 112. The source of the PMOST 111 and the source of the PMOST 112 are connected to the GND (0 V). Furthermore, the input signal (IN) having the VDD3 to 0 voltage amplitude is fed to the gate of the PMOST 111, and the inverted input signal (/IN) of the input signal (IN), which has the same voltage amplitude, is fed to the gate of the PMOST 112, respectively, to thereby extract from the drain of the PMOST 112 an output signal (OUT) that has undergone a level conversion. It is to be noted that an inverted output signal (/OUT) of the above-mentioned output signal (OUT) can be extracted from the drain of the PMOST 111.

A structure in which the NMOST 109 and 110 in Embodiment 3 are removed is the structure of the level shifter of Embodiment 7, and the operation thereof is basically the same as that of Embodiment 3. There is no problem in removing the NMOST 109 and 110 because they do not fulfill their original roles in the level conversion of a large level difference. The level shifter of Embodiment 7 converts a signal having the VDD3 to 0 voltage amplitude to a signal having a (VDD4-$V_{th2}$) to 0 voltage amplitude. Here, $V_{th2}$ denotes the threshold voltage of the NMOST 117 or 118.

Thus, similar to Embodiment 3, the level shifter of Embodiment 7 as compared with the conventional example can easily perform a level conversion that has a large level difference and the operating speed thereof is improved. Further, the penetrating current is small and therefore has an effect in the reduction of consumption power. In addition, the level shifter of Embodiment 7 is strong in regards to the characteristic fluctuations of the transistors. Note that the level shifter of Embodiment 7 is composed of the same number of transistors as that of the conventional example. Therefore, the area occupied by the circuit can be made smaller as long as level shifters having operational characteristics of about the same level is used.

[Embodiment 8]

Figure 15:
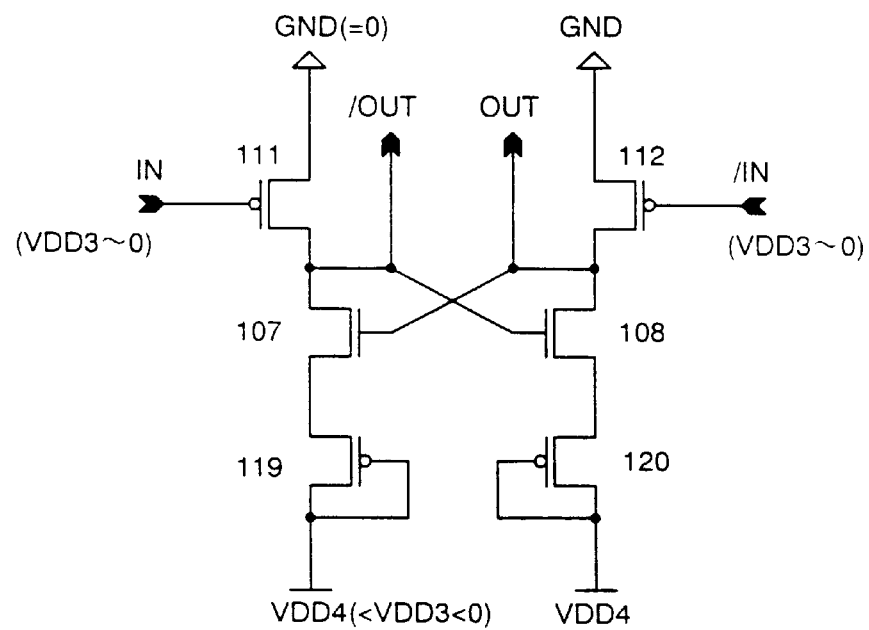
FIG. 15 is a view snowing a level shifter according to Embodiment 8 of the present invention.

An example of a different level shifter which shifts the low electric potential side of a signal with the high electric potential side thereof fixed will also be explained in Embodiment 8. As shown in FIG. 15, the level shifter of Embodiment 8 is one in which the NMOST 117 and 118 in the level shifter of Embodiment 7 illustrated in FIG. 14 are replaced by PMOST 119 and 120, respectively and the gates thereof are connected to the power source VDD4. It is to be noted that Embodiment 8 is an embodiment which specifies concrete examples of the voltage regulating circuits with respect to Embodiment Mode 4. In addition, the level shifter of Embodiment 8 is a reformed type of the level shifter of Embodiment 4 shown in FIG. 11, and hence the same reference symbols are used for denoting the transistors and the like corresponding to the respective parts.

The structure of the level shifter of Embodiment 8 is as follows. The drain and the gate of the PMOST 119 and the drain and the gate of the PMOST 120 are each connected to the power source VDD4, and the source of the PMOST 119 is connected to the source of the NMOST 107 while the source of the PMOST 120 is connected to the source of the NMOST 108, respectively. The drain of the NMOST 107 is connected to the gate of the NMOST 108 and to the drain of the PMOST 111, and the drain of the NMOST 108 is connected to the gate of the NMOST 107 and to the drain of the PMOST 112. The source of the PMOST 111 and the source of the PMOST 112 are connected to the GND (0 V). Furthermore, the input signal (IN) having the VDD3 to 0 voltage amplitude is fed to the gate of the PMOST 111, and the inverted input signal (/IN) of the input signal (IN), which has the same voltage amplitude, is fed to the gate of the PMOST 112, respectively, to thereby extract from the drain of the PMOST 112 an output signal (OUT). It is to be noted that an inverted output signal (/OUT) of the above-mentioned output signal (OUT) can be extracted from the drain of the PMOST 111. The difference between the level shifter of Embodiment 8 and that of Embodiment 4 shown in FIG. 11 is whether the NMOST 109 and 110 are provided therein or not.

A structure in which the NMOST 109 and 110 in Embodiment 4 are removed is the structure of the level shifter of Embodiment 8, and the operation thereof is basically the same as that of Embodiment 4. There is no problem in removing the NMOST 109 and 110 because they do not fulfill their original roles in the level conversion of a large level difference. The level shifter of Embodiment 8 converts a signal having the VDD3 to 0 voltage amplitude to a signal having a (VDD4−$V_{th2}$) to 0 voltage amplitude. Here, $V_{th2}$ denotes the threshold voltage of the PMOST 119 or 120.

Thus, similar to Embodiment 4, the level shifter of Embodiment 8 as compared with the conventional example can easily perform a level conversion that has a large level difference and the operating speed thereof is improved. Further, the penetrating current is small and therefore has an effect in the reduction of consumption power. In addition, the level shifter of Embodiment 8 is strong in regards to the characteristic fluctuations of the transistors. In Embodiment 8, by manufacturing the transistors so that the absolute value of the threshold voltage of the PMOST is smaller than the threshold voltage of the NMOST, the level shifter of Embodiment 8 can have an adequate margin for turning OFF the NMOST of a logic circuit for input of the output signal in a next stage. Note that the level shifter of Embodiment 8 is composed of the same number of transistors as that of the conventional example. Therefore, the area occupied by the circuit can be made smaller as long as level shifters having operational characteristics of about the same level is used.

[Embodiment 9]

In Embodiment 9, an explanation will be made on a level shifter employing a resistance as the voltage regulating circuit in Embodiment Modes 1 to 4. As the resistance, there are methods such as a method of utilizing the voltage between the source and drain of the transistor as a resistance by biasing the voltage of the gate thereof to more than its threshold voltage so that the transistor is constantly in the ON state, a method of utilizing the source and drain region of the transistor, and a method of utilizing an LDD region. There is the effect of easily performing the level conversion operation even by utilizing these resistance. Note that in this case, not only is the threshold voltage fluctuated as in Embodiments 1 to 9, but the output amplitude of the level shifter becomes a full scale one.

[Embodiment 10]

In Embodiment 10, an example of manufacturing method is described in the case where a level shifter of Embodiments 1 to 9 is applied to a driver circuit of an active matrix type liquid crystal display device. Note that a description is set forth regarding a step for fabricating the pixel TFTs, which is switching elements in the pixel portion and TFTs for driver circuit (a signal line driver circuit and a scanning line driver circuit, or the like) having level shifter provided in peripheral of the pixel portion over a same substrate. For the simplicity of the explanation, a CMOS circuit which is a fundamental structure circuit for the driver circuit portion, and an n-channel TFT for a pixel TFT in a pixel portion are illustrated with the cross section taken along a path.

Figure 16A:
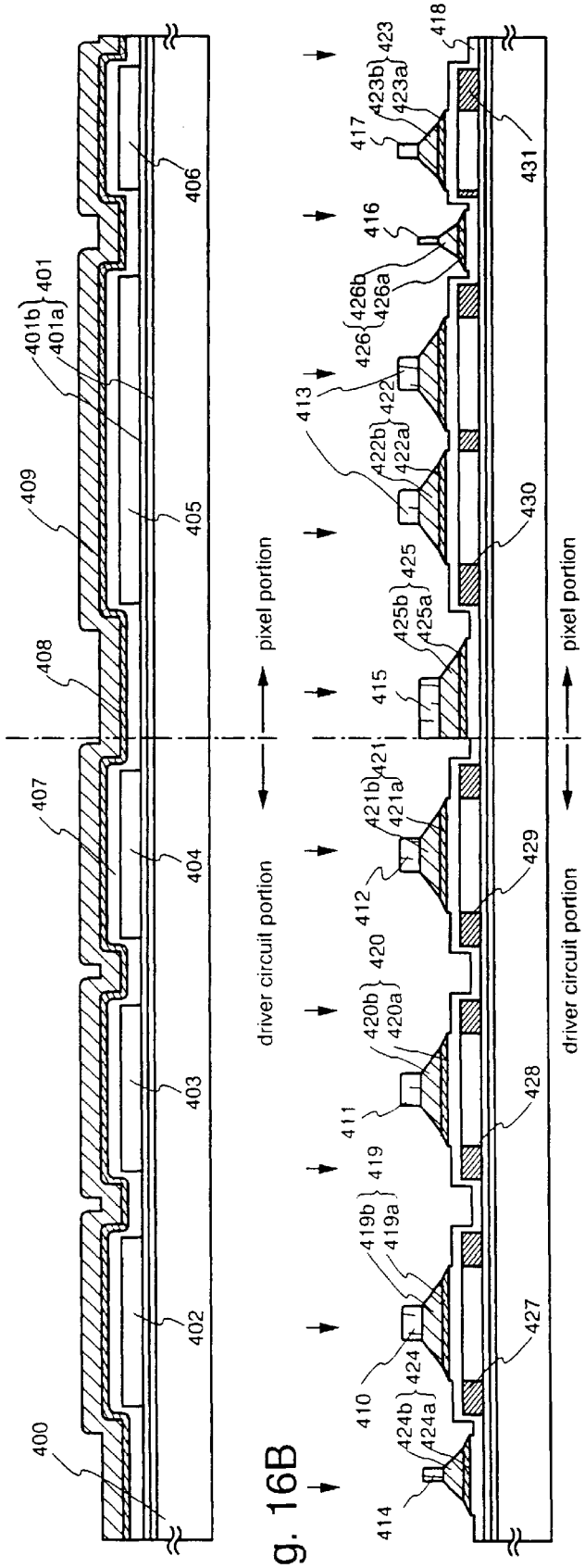

First, as shown in FIG. 16A, a base film 401 made of an insulating film such as a silicon oxide film, a silicon nitride film, or a silicon oxynitride film, is formed on a substrate 400 made of a glass such as barium borosilicate glass or aluminum borosilicate glass, typically a glass such as Corning Corp. #7059 glass or #1737 glass. For example, a lamination film of a silicon oxynitride film 401a, manufactured from $SiH_4$, $NH_3$, and $N_2O$ by plasma CVD, and formed having a thickness of 10 to 200 nm (preferably between 50 and 100 nm), and a hydrogenated silicon oxynitride film 401b, similarly manufactured from $SiH_4$ and $N_2O$, and formed having a thickness of 50 to 200 nm (preferably between 100 and 150 nm), is formed. A two layer structure is shown for the base film 401 in Embodiment 10, but a single layer film of the insulating film, and a structure in which more than two layers are laminated, may also be formed.

Island-shape semiconductor layers 402 to 406 are formed by crystalline semiconductor films made from a semiconductor film having an amorphous structure, using a laser crystallization method or a known thermal crystallization method. The thickness of the island shape semiconductor layers 402 to 406 may be formed from 25 to 80 nm (preferably between 30 and 60 nm). There are no limitations placed on the materials for forming a crystalline semiconductor film, but it is preferable to form the crystalline semiconductor films by silicon or a silicon germanium (SiGe) alloy.

A laser such as a pulse oscillation type or continuous light emission type excimer laser, a YAG laser, or a $YVO_4$ laser can be used to fabricate the crystalline semiconductor films by the laser crystallization method. A method of condensing laser light emitted from a laser oscillator into a linear shape by an optical system and then irradiating the light to the semiconductor film may be used when these types of lasers are used. The crystallization conditions may be suitably selected by the operator, but when using the excimer laser, the pulse oscillation frequency is set to 30 Hz, and the laser energy density is set form 100 to 400 mJ/cm² (typically between 200 and 300 mJ/cm²). Further, when using the YAG laser, the second harmonic is used and the pulse oscillation frequency is set from 1 to 10 kHz, and the laser energy density may be set from 300 to 600 mJ/cm² (typically between 350 and 500 mJ/cm²). The laser light condensed into a linear shape with a width of 100 to 1000 μm, for example 400 µm, is then irradiated over the entire surface of the substrate. This is performed with an overlap ratio of 80 to 98% for the linear laser light.

A gate insulating film 407 is formed covering the island shape semiconductor layers 402 to 406. The gate insulating film 407 is formed of an insulating film containing silicon with a thickness of 40 to 150 nm by plasma CVD or sputtering. A 120 nm thick silicon oxynitride film is formed in Embodiment 10. The gate insulating film is not limited to this type of silicon oxynitride film, of course, and other insulating films containing silicon may also be used in a single layer or in a lamination structure. For example, when using a silicon oxide film, it can be formed by plasma CVD with a mixture of TEOS (tetraethyl orthosilicate) and $O_2$, at a reaction pressure of 40 Pa, with the substrate temperature set from 300 to 400° C., and by discharging at a high frequency (13.56 MHz) electric power density of 0.5 to 0.8 W/cm$^2$. Good characteristics as a gate insulating film can be obtained by subsequently performing thermal annealing, at between 400 and 500° C. of the silicon oxide film thus manufactured.

A first conductive film 408 and a second conductive film 409 are then formed on the gate insulating film 407 in order to form gate electrodes (a portion corresponding to a gate of the TFT). The first conductive film 408 is formed of a Ta film with a thickness of 50 to 100 nm, and the second conductive film 409 is formed of a W film having a thickness of 100 to 300 nm, in Embodiment 10.

The Ta film is formed by sputtering, and sputtering of a Ta target is performed by Ar. If appropriate amounts of Xe and Kr are added to Ar, the internal stress of the Ta film is relaxed, and film peeling can be prevented. The resistivity of an α phase Ta film is about 20 µΩcm, and it can be used in the gate electrode, but the resistivity of a β phase Ta film is about 180 µΩcm and it is unsuitable for the gate electrode. The α phase Ta film can easily be obtained if a tantalum nitride film, which possesses a crystal structure similar to that of α phase Ta, is formed with a thickness of about 10 to 50 nm as a base for a Ta film in order to form the α phase Ta film.

The W film is formed by sputtering with a W target, which can also be formed by thermal CVD using tungsten hexafluoride ($WF_6$). Whichever is used, it is necessary to make the film become low resistance in order to use it as the gate electrode, and it is preferable that the resistivity of the W film be made equal to or less than 20 µΩcm. The resistivity can be lowered by enlarging the crystal grains of the W film, but for cases in which there are many impurity elements such as oxygen within the W film, crystallization is inhibited, thereby the film becomes high resistance. A W target having a purity of 99.9999% is thus used in sputtering. In addition, by forming the W film while taking sufficient care that no impurities from the gas phase are introduced at the time of film formation, the resistivity of 9 to 20 µΩcm can be achieved.

Note that, although the first conductive film 408 is a Ta film and the second conductive film 409 is a W film in Embodiment 10, both may also be formed from an element selected from the group consisting of Ta, W, Ti, Mo, Al, and Cu, or from an alloy material having one of these elements as its main constituent, and a chemical compound material. Further, a semiconductor film, typically a polycrystalline silicon film into which an impurity element such as phosphorus is doped, may also be used. Examples of preferable combinations other than that used in Embodiment 10 include: forming the first conductive film by tantalum nitride (TaN) and combining it with the second conductive film formed from a W film; forming the first conductive film by tantalum nitride (TaN) and combining it with the second conductive film formed from an Al film; and forming the first conductive film by tantalum nitride (TaN) and combining it with the second conductive film formed from a Cu film. Whichever is used, it is preferable to combine the conductive materials which can be etched with the suitable selectivity.

Then, masks 410 to 417 are formed from resist, and a first etching treatment is performed in order to form electrodes and wirings. An ICP (inductively coupled plasma) etching method is used in Embodiment 10. A gas mixture of $CF_4$ and $Cl_2$ is used as an etching gas, and a plasma is generated by applying a 500 W RF electric power (13.56 MHz) to a coil shape electrode at 1 Pa. A 100 W RF electric power (13.56 MHz) is also applied to the substrate side (test piece stage), effectively applying a negative self-bias voltage. In case of mixing $CF_4$ and $Cl_2$, the W film and the Ta film are etched to the approximately same level.

Edge portions of the first conductive layer and the second conductive layer are made into a tapered shape in accordance with the effect of the bias voltage applied to the substrate side under the above etching conditions by using a suitable resist mask shape. The angle of the tapered portions is from 15 to 45°. The etching time may be increased by approximately 10 to 20% in order to perform etching without any residue remaining on the gate insulating film. The selectivity of a silicon oxynitride film with respect to a W film is from 2 to 4 (typically 3), and therefore approximately 20 to 50 nm of the exposed surface of the silicon oxynitride film is etched by this over-etching process. First shape conductive layers 419 to 426 (first conductive layers 419a to 426a and second conductive layers 419b to 426b) are thus formed of the first conductive layers and the second conductive layers in accordance with the first etching process. Reference numeral 418 denotes a gate insulating film, and the regions not covered by the first shape conductive layers 419 to 426 are made thinner by etching of about 20 to 50 nm.

A first doping process is then performed, and an impurity element which imparts n-type conductivity is added. (FIG. 16B) Ion doping or ion injection may be performed for the method of doping. Ion doping is performed under the conditions of a dose amount of from $1 \times 10^{13}$ to $5 \times 10^{14}$ atoms/cm$^2$ and an acceleration voltage of 60 to 100 keV. A periodic table group 15 element, typically phosphorus (P) or arsenic (As) is used as the impurity element which imparts n-type conductivity, and phosphorus (P) is used here. The conductive layers 419 to 423 become masks with respect to the n-type conductivity imparting impurity element in this case, and first impurity regions 427 to 431 are formed in a self-aligning manner. The impurity element which imparts n-type conductivity is added to the first impurity regions 427 to 431 with a concentration in the range of $1 \times 10^{20}$ to $1 \times 10^{21}$ atoms/cm$^3$.

Figure 16C:
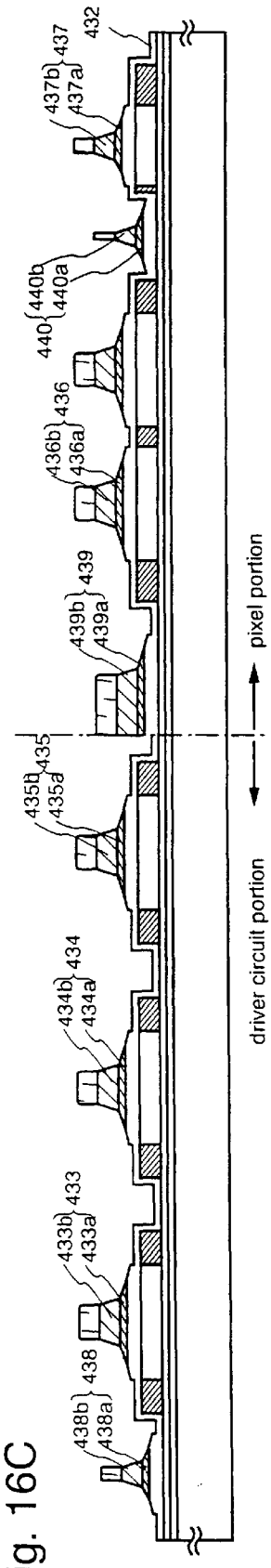

A second etching process is performed next, as shown in FIG. 16C. The ICP etching method is similarly used, a mixture of $CF_4$, $Cl_2$, and $O_2$ is used as the etching gas, and a plasma is generated by supplying a 500W RF electric power (13.56 MHz) to a coil shape electrode at a pressure of 1 Pa. A 50W RF electric power (13.56 MHz) is applied to the substrate side (test piece stage), and a self-bias voltage which is lower in comparison to that of the first etching process is applied. The W film is etched anisotropically under these etching conditions, and Ta (the first conductive layers) is anisotropically etched at a slower etching speed, forming second shape conductive layers 433 to 440 (first conductive layers 433a to 440a and second conductive layers 433b to 440b). Reference numeral 432 denotes a gate insulating film, and regions not covered by the second shape conductive layers 433 to 437 are additionally etched on the order of 20 to 50 nm, forming thinner regions.

The etching reaction of a W film or a Ta film in accordance with a mixed gas of $CF_4$ and $Cl_2$ can be estimated from the radicals generated and from the ion types and vapor pressures of the reaction products. Comparing the vapor pressures of fluorides and chlorides of W and Ta, the W fluoride compound $WF_6$ is extremely high, and the vapor pressures of $WCl_5$, $TaF_5$, and $TaCl_5$ are of similar order. Therefore the W film and the Ta film are both etched by the $ClF_4$ and $Cl_2$ gas mixture. However, if a suitable quantity of $O_2$ is added to this gas mixture. $CF_4$ and $O_2$ react, forming CO and F, and a large amount of F radicals or F ions is generated. As a result, the etching speed of the W film having a high fluoride vapor pressure is increased. On the other hand, even if F increases, the etching speed of Ta does not relatively increase. Further, Ta is easily oxidized compared to W, and therefore the surface of Ta is oxidized by the addition of $O_2$. The etching speed of the Ta film is further reduced because Ta oxides do not react with fluorine and chlorine. Therefore, it becomes possible to have a difference in etching speeds between the W film and the Ta film, and it becomes possible to make the etching speed of the W film larger than that of the Ta film.

A second doping process is then performed, as shown in FIG. 17A. The dose amount is made smaller than that of the first doping process in this case, and an impurity element which imparts n-type conductivity is doped under high acceleration voltage conditions. For example, doping is performed with the acceleration voltage set from 70 to 120 keV, and a dose amount of $1\times10^{13}$ atoms/cm$^3$, and a new impurity region is formed inside the first impurity region formed in the island shape semiconductor layers of FIG. 16B. The second conductive layers 433 to 437 are used as masks with respect to the impurity element, and doping is performed so as to also add the impurity element into regions under the first conductive layers 433a to 437a. Third impurity regions 441 to 445 that overlap the first conductive layers 433a to 437a, and second impurity regions 446 to 450 between the first impurity regions and the third impurity regions are thus formed. The impurity element which imparts n-type conductivity is added such that the concentration becomes from $1\times10^{17}$ to $1\times10^{19}$ atoms/cm$^3$ in the second impurity regions, and becomes from $1\times10^{16}$ to $1\times10^{18}$ atoms/cm$^3$ in the third impurity regions.

Fourth impurity regions 454 to 456 added with an impurity element having a conductivity type which is the opposite of the above conductive type impurity element, are then formed as shown in FIG. 17B in the island shape semiconductor layers 403 which form p-channel TFTs. The second conductive layer 434 is used as a mask with respect to the impurity element, and the impurity regions are formed in a self-aligning manner. The island shape semiconductor layers 402, 404, 405, and 406, which form n-channel TFTs, are covered over their entire surface areas by resist masks 451 to 453. Phosphorus is added to the impurity regions 454 to 456 at a different concentration, and ion doping is performed here using diborane ($B_2H_6$), so that the respective impurity regions have the impurity concentration of $2\times10^{20}$ to $2\times10^{21}$ atoms/cm$^3$.

Impurity regions are formed in the respective island shape semiconductor layers by the above processes. The conductive layers 433 to 436 overlapping the island shape semiconductor layers function as gate electrodes. Further, reference numeral 439 denotes a signal line, 440 denotes a scanning line, 437 denotes a capacitor wiring and 438 denotes a driver circuit.

A process of activating the impurity elements added to the respective island shape semiconductor layers is then performed, as shown in FIG. 17C, with the aim of controlling conductivity type. Thermal annealing using an annealing furnace is performed for this process. In addition, laser annealing and rapid thermal annealing (RTA) can also be applied. Thermal annealing is performed with an oxygen concentration equal to or less than 1 ppm, preferably equal to or less than 0.1 ppm, in a nitrogen atmosphere at 400 to 700° C., typically between 500 and 600° C. Heat treatment is performed for 4 hours at 500° C. in Embodiment 10. However, for cases in which the wiring material used in the wirings 433 to 440 is weak with respect to heat, it is preferable to perform activation after forming an interlayer insulating film (having silicon as its main constituent) in order to protect the wirings and the like.

In addition, heat treatment is performed for 1 to 12 hours at 300 to 450° C. in an atmosphere containing between 3 and 100% hydrogen, performing hydrogenation of the island shape semiconductor layers. This process is one of terminating dangling bonds in the island shape semiconductor layers by hydrogen which is thermally excited. Plasma hydrogenation (using hydrogen excited by a plasma) may also be performed as another means of hydrogenation.

A first interlayer insulating film 457 is formed next of a silicon oxynitride film having a thickness of 100 to 200 nm. A second interlayer insulating film 458 made of an organic insulating material is then formed on the first interlayer insulating film 457. Etching is then performed in order to form contact holes.

Then, source wirings 459 to 461 for forming contacts with source regions (corresponding to a source of the TFT), and drain wirings 462 to 464 for forming contacts with drain regions (corresponding to a drain of the TFT), of the island shape semiconductor layers in a driver circuit portion are then formed. Further, in a pixel portion, pixel electrodes 466 and 467, and a connection electrode 465 are formed. (See FIG. 18.) An electrical connection is made, in accordance with the connection electrode 465, between the signal line 439 and a pixel TFT 504. The pixel electrode 466 forms electrical connections with the island shape semiconductor layer 405 corresponding to the active layer of the pixel TFT and the island shape semiconductor layer forming a storage capacitor (not shown in figure). Note that the pixel electrode 467 and storage capacitance 505 are shared between adjacent pixels.

The driver circuit portion having an n-channel TFT 501, a p-channel TFT 502, and an n-channel TFT 503; and the pixel portion having the pixel TFT 504 and a storage capacitor 505 can thus be formed on the same substrate. For convenience, this type of substrate is referred to as an active matrix substrate throughout this specification.

The n-channel TFT 501 of the driver circuit portion has a channel forming region 468; the third impurity region 441 (GOLD region) overlapping the conductive layer 433, which forms a gate electrode; the second impurity region 446 (LDD region) formed outside the gate electrode; and the first impurity region 427 which functions as a source region or a drain region. The p-channel TFT 502 has a channel forming region 469; the fourth impurity region 456 overlapping the conductive layer 434, which forms a gate electrode; the fourth impurity region 455 formed outside the gate electrode; and the fourth impurity region 454 which functions as a source region or a drain region. The n-channel TFT 503 has a channel forming region 470; the third impurity region 443 (GOLD region) overlapping the conductive layer 435, which forms a gate electrode; the second impurity region 448 (LDD region) formed outside the gate electrode; and the first impurity region 429 which functions as a source region or a drain region.

The pixel TFT 504 of the pixel portion has a channel forming region 471; the third impurity region 444 (GOLD region) overlapping the conductive layer 436), which forms a gate electrode; the second impurity region 449 (LDD region) formed outside the gate electrode; and the first impurity region 430 which functions as a source region or a drain region. Further, an impurity element which imparts n-type conductivity is added: to the semiconductor layer 431, which functions as one electrode of the storage capacitor 505, at the same concentration as in the first impurity regions; to the semiconductor layer 445 at the same concentration as in the third impurity regions; and to the semiconductor layer 450 at the same concentration as in the second impurity regions. The storage capacitor is formed by the capacitor wiring 437, and an insulating layer therebetween (the same layer as the gate insulating film).

Further, edge portions of the pixel electrodes are arranged overlapping a signal line and a scanning line such that the gaps between the pixel electrodes can be shielded from light without using a black matrix.

Furthermore, in accordance with the processes shown in Embodiment 10, the active matrix substrate can be manufactured by using five photomasks (an island shape semiconductor layer pattern, a first wiring pattern (scanning line, signal line, capacitor wirings), an n-channel region mask pattern, a contact hole pattern, and a second wiring pattern (including pixel electrodes and connection electrodes). As a result, the processes can be reduced, and this contributes to a reduction in the manufacturing costs and an increase in throughput.

[Embodiment 11]

Figure 19:
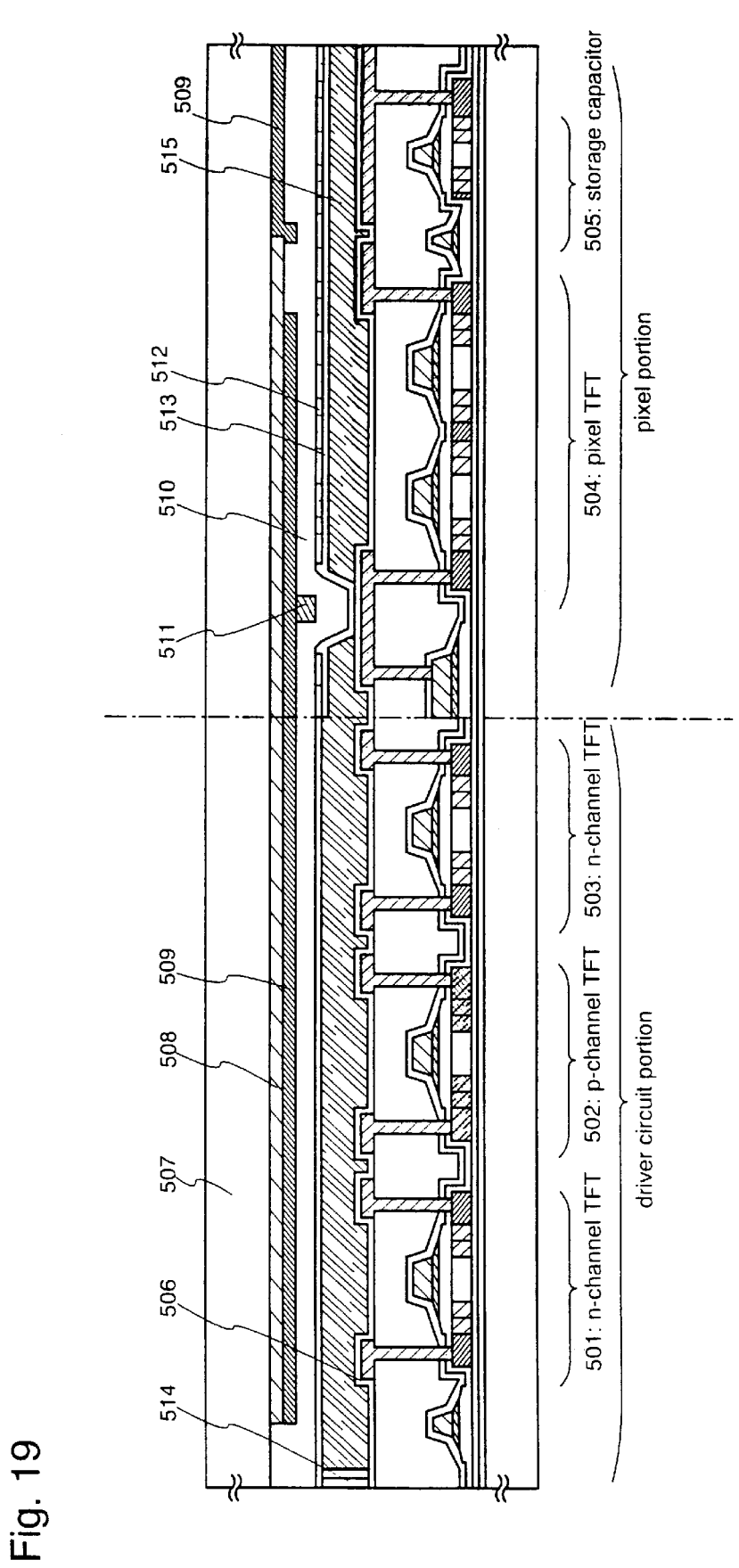
FIG. 19 is a diagram showing a cross-sectional structure of an active matrix liquid crystal display device.

A process of manufacturing an active matrix liquid crystal display device from the active matrix substrate manufactured in Embodiment 10 is explained below in Embodiment 11. FIG. 19 is used for the explanation.

Figure 18:
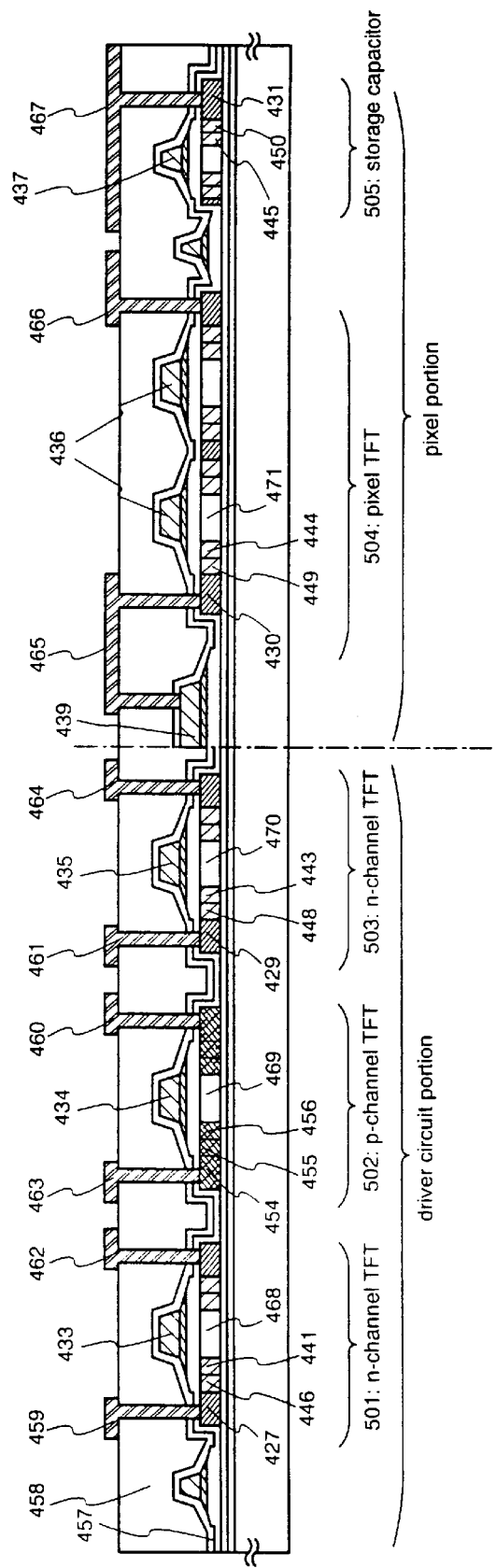
FIG. 18 is a diagram showing a cross-sectional view of an active matrix substrate.

After first obtaining the active matrix substrate of FIG. 18 in accordance with Embodiment 10, an alignment film 506 is formed on the active matrix substrate of FIG. 18, and a rubbing process is performed.

An opposing substrate 507 is prepared. Color filter layers 508 and 509, and an overcoat layer 510 are formed on the opposing substrate 507. The color filter layers are formed such that the color filter layer 508, having a red color, and the color filter 509, having a blue color, are overlapped with each other, and also serve as a light shielding film. It is necessary to shield at least the spaces between the TFTs, and the connection electrodes and the pixel electrodes when using the substrate of Embodiment 10, and therefore, it is preferable that the red color filters and the blue color filters are arranged so as to overlap and shield the necessary positions.

Further, combined with the connection electrode 465, the red color filter layer 508, the blue color filter layer 509, and a green color filter layer 511 are overlaid. forming a spacer. Each color filter is formed having a thickness of 1 to 3 $\mu$m by mixing a pigment into an acrylic resin. A predetermined pattern can be formed using a mask which uses a photosensitive material. Considering the thickness of the overcoat layer of 1 to 4 $\mu$m, the height of the spacers can be made from 2 to 7 $\mu$m, preferably between 4 and 6 $\mu$m. A gap is formed by this height when the active matrix substrate and the opposing substrate are joined together. The overcoat layer 510 is formed by an optical hardening, or a thermosetting, organic resin material, and materials such as polyimide and acrylic resin are used, for example.

The arrangement of the spacers may be determined arbitrarily, and the spacers may be arranged on the opposing substrate so as to line up with positions over the connection electrodes, as shown in FIG. 19, for example. Further, the spacers may also be arranged on the opposing substrate so as to line up with positions over the TFTs of the driver circuit. The spacers may be arranged over the entire surface of the driver circuit portion, and they may be arranged so as to cover source wirings and drain wirings.

An opposing electrode 512 is formed by patterning after forming the overcoat layer 510, and a rubbing process is performed after forming an alignment film 513.

The active matrix substrate on which the pixel portion and the driver circuit are formed, and the opposing substrate are then joined together by a sealant 514. A filler is mixed into the sealant 514, and the two substrates are joined together with a uniform gap maintained by the filler and the spacers. A liquid crystal material 515 is then injected between both the substrate, and this is completely sealed by using a sealing material (not shown in the figure). A known liquid crystal material may be used as the liquid crystal material 515. The active matrix liquid crystal display device shown in FIG. 19 is thus completed.

While the TFT manufactured by the above mentioned process has a top gate structure, the present invention can be also applied to the bottom gate structure TFT or other structure TFT.

The present invention can be applied to the light emitting device using a light emitting element substituting for a liquid crystal material, the image display device is of self emission type. The light emitting device referred to in this specification includes triplet-based light emission devices and/or singlet-based light emission device, for example.

[Embodiment 12]

In this embodiment, electronic equipments incorporated a light emitting device and a active matrix type liquid crystal device using the level shifter of this present invention is explained in Embodiment 12. Mentioned as such electronic equipments, a portable information terminal (such as electronic book, mobile computer or mobile telephone), a video camera, a steel camera, a personal computer, a television and so forth. Examples of the electronic equipment are illustrated in FIGS. 20 and 22. An active matrix type liquid crystal display device is applied to FIG. 20, FIG. 21 and FIG. 22, and a light emitting device is applied to FIG. 20 and FIG. 21.

Figure 20A:
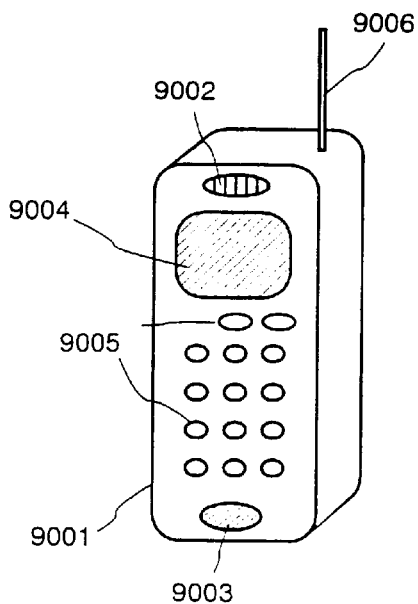
FIGS. 20A to 20F are diagrams showing examples of electronic equipments employing the present invention.

FIG. 20A shows a mobile phone, which includes the body 9001, a sound output unit 9002, a sound input unit 9003, display device 9004, an operating switch 9005, an antenna 9006. The present invention can be applied to a display device 9004.

Figure 20B:
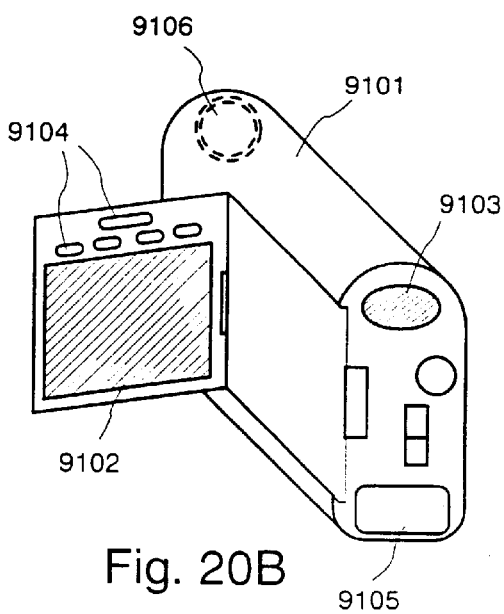

FIG. 20B shows a video camera, which includes the body 9101, a display unit 9102, a sound input unit 9103, operating switches 9104, a battery 9105, and an image receiving unit 9106. The present invention can be applied to a display device 9102.

Figure 20C:
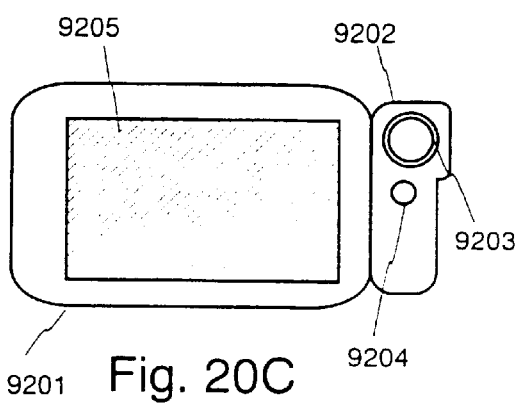

FIG. 20C shows a mobile computer, a kind of a personal computer, or a portable information terminal which includes the body 9201, camera unit 9202, an image receiving unit 9203, an operating switch 9204, a display unit 9205. The present invention can be applied to a display unit 9205.

Figure 20D:
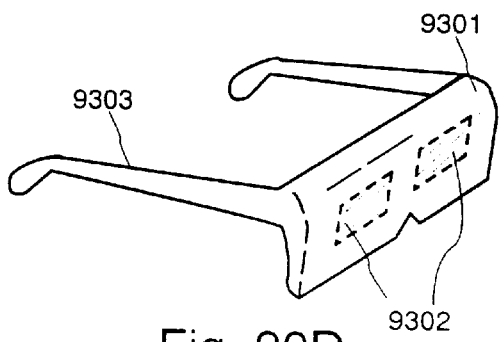

FIG. 20D shows a head mounted display (the goggle type display), which includes the body 9301, a display device 9302, arm portion 9303. The present invention can be applied to the display device 9302.

Figure 20E:
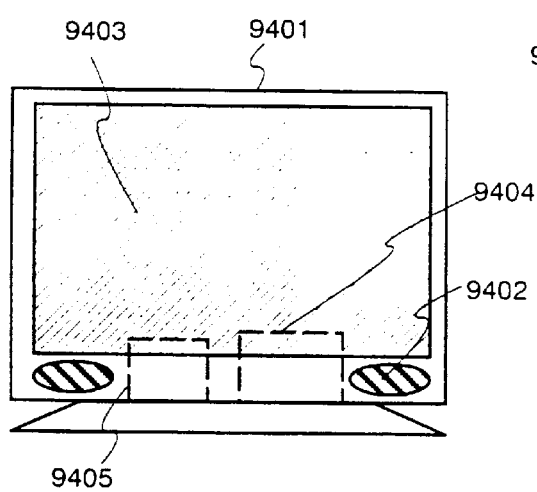

FIG. 20E shows a television, which includes the body 9401, a speaker 9402, a display unit 9403, a receiving device 9404, amplifier 9405. The present invention can be applied to the display unit 9403.

Figure 20F:
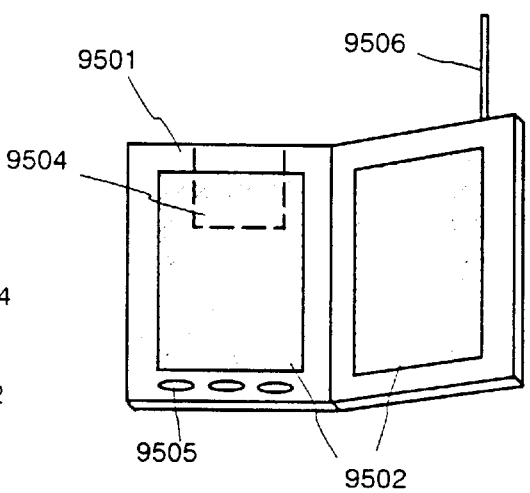

FIG. 20F shows a portable book, which includes the body 9501, display units 9502, the record medium 9504, an operating switch 9505 and an antenna 9506. This book displays a data recorded in mini disc (MD) and DVD (Digital Versatile Disc). and a data received by an antenna. The present invention can be applied to the display units 9502.

Figure 21A:
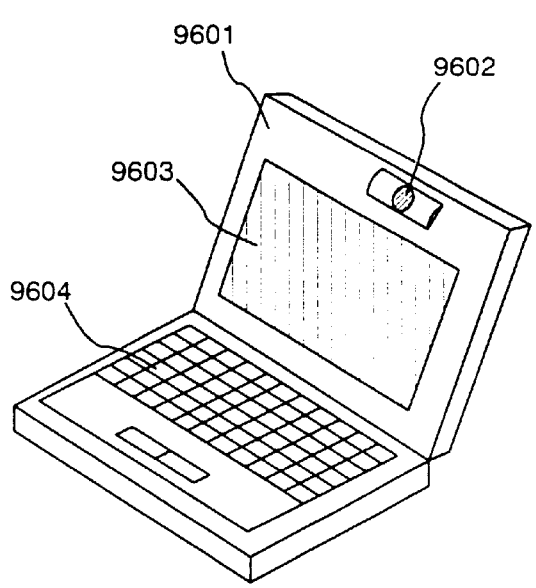
FIGS. 21A and 21D are diagrams showing examples of electronic equipments employing the present invention.

FIG. 21A shows a personal computer, which includes the body 9601, an image receiving unit 9602, a display device 9603 and a keyboard 9604. The present invention can be applied to the display device 9603.

Figure 21B:
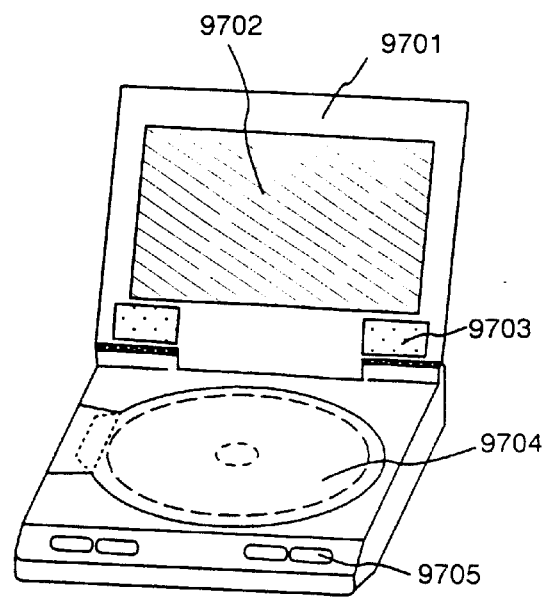

FIG. 21B shows a player using recording medium (herein after described as a recording medium) recorded a program, which includes the body 9701, the display unit 9702, the speaker unit 9703, the record medium 9704, the operating switches 9705. This equipment can be realized music appreciation, movie appreciation. playing game and Internet by using the DVD, CD etc. as a recording medium. The present invention can be applied to the display unit 9702.

Figure 21C:
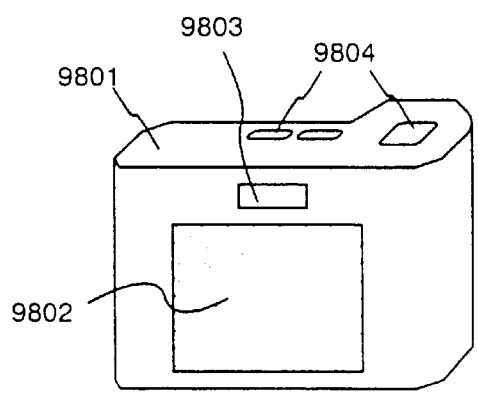

FIG. 21C shows a digital camera, which includes the body 9801, display unit 9802, a view finder 9803, an operating switch 9804 and an image receiving unit (not shown). The present invention can be applied to the display unit 9802.

Figure 21D:
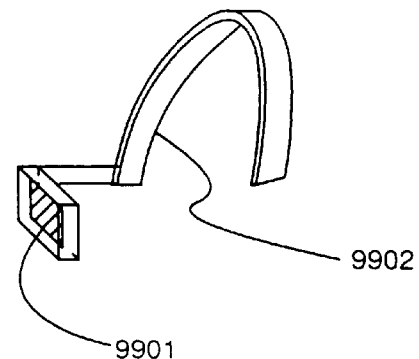

FIG. 21D shows one-eyed head mount display, which includes the display unit 9901 and the head mount portion 9902. The present invention can be applied to the display unit 9901.

Figure 22A:
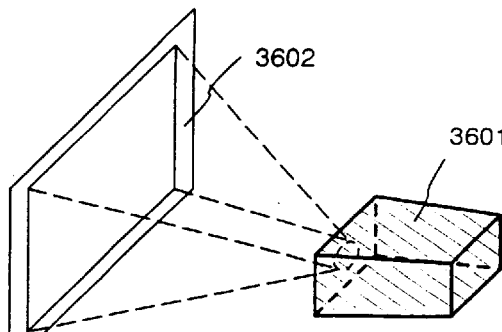
FIGS. 22A and 22D are diagrams showing a structure of a projector type liquid crystal display device.

FIG. 22A shows a front type projector, which includes the projection units 3601, and a screen 3602.

Figure 22B:
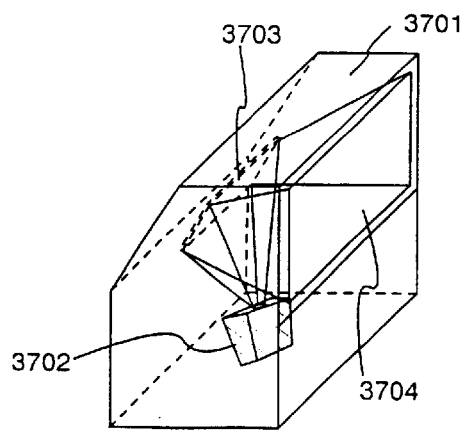

FIG. 22B shows a rear type projector, which includes the body 3701, the projection units 3702, a mirror 3703 and a screen 3704.

Figure 22C:
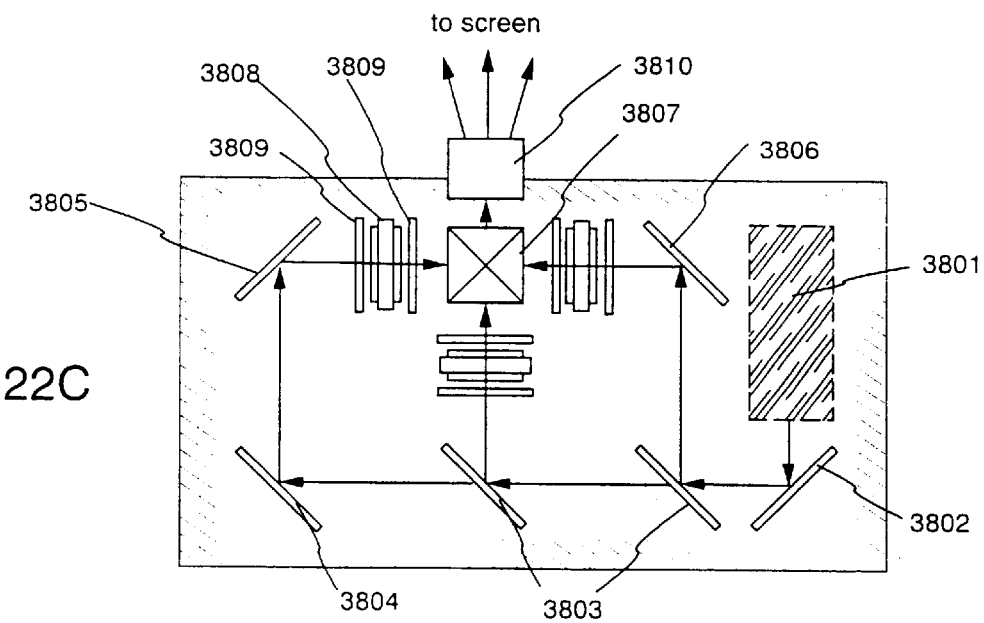

Illustrated in FIG. 22C is an example of the structure of the projection units 3601 and 3702 that are shown in FIGS. 22A and 22B, respectively. Each of the projection units 3601 and 3702 is comprised of a light source optical system 3801, mirrors 3802 and 3804 to 3806, dichroic mirrors 3803, a prism 3807, liquid crystal display devices 3808, phase difference plates 3809, and a projection optical system 3810. The projection optical system 3810 is constructed of an optical system including projection lenses. An example of a three plate system is shown in embodiment 12, but there are no special limitations. For instance, an optical system of single plate system is acceptable. Further, the operator may suitably set optical systems such as optical lenses, polarizing film, film to regulate the phase difference, IR film, within the optical path shown by the arrows in FIG. 22C.

Figure 22D:
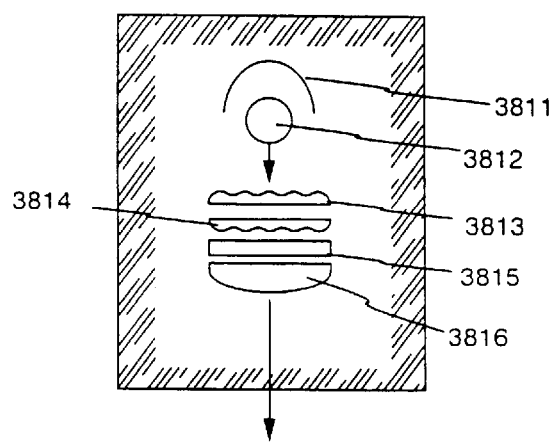

In addition, FIG. 22D shows an example of the structure of the light source optical system 3801 of FIG. 22C. In this embodiment, the light source optical system 3801 is composed of a reflector 3811, a light source 3812, lens arrays 3813 and 3814, a polarizing conversion element 3815, and a condenser lens 3816. Note that tile light source optical system shown in FIG. 22D is an example, and it is not limited to the illustrated structure. For example, the operator may suitably set optical systems such as optical lenses, polarizing film, film to regulate the phase difference, and IR film.

As described above, the present invention has very wide applications and is applicable to electronic equipment using an image display device in all fields.

According to the level shifter of the present invention, the penetrating current that occurs during the transient period of the level conversion operation is reduced, making it possible to readily perform the level conversion of voltage amplitudes having a large difference. In addition, it is also possible to suppress the area occupied by the circuit from increasing as well as improve its operational speed. Thus, the level shifter of the present invention having a low consumption power but a large operational margin is effective in enhancing the yield and reducing the manufacturing costs.

What is claimed is:

1. A level shifter comprising:
   a first MOS transistor of a first conductive type having a source connected to a first power source, and a gate to which a first input signal is inputted;
   a second MOS transistor of a same conductive type as said first conductive type, having a source connected to said first power source, and a gate to which a second input signal is inputted, wherein said second input signal is an inverted signal of said first input signal;
   a third MOS transistor of a second conductive type different from said first conductive type, having a drain connected to a drain of said first MOS transistor, and a gate to which said first input signal is inputted;
   a fourth MOS transistor of a same conductive type as said second conductive type, having a drain connected to a drain of said second MOS transistor, and a gate to which said second input signal is inputted;
   a fifth MOS transistor of a same conductive type as said second conductive type, having a drain connected to a source of said third MOS transistor, and a gate connected to a drain of said second MOS transistor;
   a sixth MOS transistor of a same conductive type as said second conductive type, having a drain connected to a source of said fourth MOS transistor, and a gate connected to a drain of said first MOS transistor;
   a first voltage regulating circuit connected between a source of said fifth MOS transistor and a second power source; and
   a second voltage regulating circuit connected between a source of said sixth MOS transistor and said second power source,
   wherein said first and second input signals of a first voltage amplitude is converted to a signal of a second voltage amplitude to thereby output a signal from at least one of said drains of said first MOS transistor or said second MOS transistor.

2. A level shifter according to claim 1, wherein said voltage regulating circuit comprises a MOS transistor having a drain and a gate thereof connected.

3. A level shifter according to claim 1, wherein said voltage regulating circuit has a resistor containing a polycrystalline silicon layer or a silicon layer doped with an impurity element.

4. A level shifter according to claim 1, wherein said voltage regulating circuit includes a MOS transistor having a constant voltage applied to a gate thereof.

5. A level shifter according to claim 1, wherein a voltage of said first power source is fixed to 0 V.

6. A level shifter according to claim 1, wherein said level shifter is incorporated in an active matrix type liquid crystal display device or a light emitting display device.

7. A level shifter according to claim 1, wherein said level shifter is incorporated in one selected from the group consisting of a mobile telephone, a video camera, a personal computer, a head mount display, a television, a portable book, a DVD player, a digital camera, and a projector.

8. A level shifter comprising:
a first MOS transistor of a first conductive type having a source connected to a first power source, and a gate to which a first input signal is inputted;
a second MOS transistor of a same conductive type as said first conductive type, having a source connected to said first power source, and a gate to which a second input signal is inputted, wherein said second input signal is an inverted signal of said first input signal;
a third MOS transistor of a second conductive type different from said first conductive type, having a drain connected to a drain of said first MOS transistor, and a gate connected to a drain of said second MOS transistor:
a fourth MOS transistor of a same conductive type as said second conductive type, having a drain connected to a drain of said second MOS transistor, and a gate connected to a drain of said first MOS transistor;
a first voltage regulating circuit connected between a source of said third MOS transistor and a second power source; and
a second voltage regulating circuit connected between a source of said fourth MOS transistor and said second power source,
wherein said first and second input signals of a first voltage amplitude is converted to a signal of a second voltage amplitude to thereby output a signal from at least one of said drains of said first MOS transistor or said second MOS transistor.

9. A level shifter according to claim 8, wherein said voltage regulating circuit comprises a MOS transistor having a drain and a gate thereof connected.

10. A level shifter according to claim 8, wherein said voltage regulating circuit has a resistor containing a polycrystalline silicon layer or a silicon layer doped with an impurity element.

11. A level shifter according to claim 8, wherein said voltage regulating circuit includes a MOS transistor having a constant voltage applied to a gate thereof.

12. A level shifter according to claim 8, wherein a voltage of said first power source is fixed to 0 V.

13. A level shifter according to claim 8, wherein said level shifter is incorporated in an active matrix type liquid crystal display device or a light emitting display device.

14. A level shifter according to claim 8, wherein said level shifter is incorporated in one selected from the group consisting of a mobile telephone, a video camera, a personal computer, a head mount displays a television, a portable book, a DVD player, a digital camera, and a projector.

15. A level shifter comprising:
a first MOS transistor of a first conductive type having a source connected to a first power source, and a gate to which a first input signal is inputted;
a second MOS transistor of a same conductive type as said first conductive type, having a source connected to said first power source, and a gate to which a second input signal is inputted, wherein said second input signal is an inverted signal of said first input signal;
a third MOS transistor of a second conductive type different from said first conductive type, having a drain connected to a drain of said first MOS transistor, and a gate to which said first input signal is inputted;
a fourth MOS transistor of a same conductive type as said second conductive type, having a drain connected to a drain of said second MOS transistor, and a gate to which said second input signal is inputted;
a fifth MOS transistor of a same conductive type as said second conductive type, having a drain connected to a source of said third MOS transistor, and a gate connected to a drain of said second MOS transistor;
a sixth MOS transistor of a same conductive type as said second conductive type, having a drain connected to a source of said fourth MOS transistor, and a gate connected to a drain of said first MOS transistor;
a first voltage regulating circuit connected between a source of said fifth MOS transistor and a second power source; and
a second voltage regulating circuit connected between a source of said sixth MOS transistor and said second power source.

16. A level shifter according to claim 15, wherein said voltage regulating circuit comprises a MOS transistor having a drain and a gate thereof connected.

17. A level shifter according to claim 15, wherein said voltage regulating circuit has a resistor containing a polycrystalline silicon layer or a silicon layer doped with an impurity element.

18. A level shifter according to claim 15, wherein said voltage regulating circuit includes a MOS transistor having a constant voltage applied to a gate thereof.

19. A level shifter according to claim 15, wherein a voltage of said first power source is fixed to 0 V.

20. A level shifter according to claim 15, wherein said level shifter is incorporated in an active matrix type liquid crystal display device or a light emitting display device.

21. A level shifter according to claim 15, wherein said level shifter is incorporated in one selected from the group consisting of a mobile telephone, a video camera, a personal computer, a head mount display, a television, a portable book, a DVD player, a digital camera, and a projector.

22. A level shifter comprising:
a first MOS transistor of a first conductive type having a source connected to a first power source, and a gate to which a first input signal is inputted;
a second MOS transistor of a same conductive type as said first conductive type, having a source connected to said first power source, and a gate to which a second input signal is inputted, wherein said second input signal is an inverted signal of said first input signal;
a third MOS transistor of a second conductive type different from said first conductive type, having a drain connected to a drain of said first MOS transistor, and a gate connected to a drain of said second MOS transistor;
a fourth MOS transistor of a same conductive type as said second conductive type, having a drain connected to a drain of said second MOS transistor, and a gate connected to a drain of said first MOS transistor;
a first voltage regulating circuit connected between a source of said third MOS transistor and a second power source; and
a second voltage regulating circuit connected between a source of said fourth MOS transistor and said second power source.

23. A level shifter according to claim 22, wherein said voltage regulating circuit comprises a MOS transistor having a drain and a gate thereof connected.

24. A level shifter according to claim 22, wherein said voltage regulating circuit has a resistor containing a polycrystalline silicon layer or a silicon layer doped with an impurity element.

25. A level shifter according to claim 22, wherein said voltage regulating circuit includes a MOS transistor having a constant voltage applied to a gate thereof.

26. A level shifter according to claim 22, wherein a voltage of said first power source is fixed to 0 V.

27. A level shifter according to claim 22, wherein said level shifter is incorporated in an active matrix type liquid crystal display device or a light emitting display device.

28. A level shifter according to claim 22, wherein said level shifter is incorporated in one selected from the group consisting of a mobile telephone, a video camera, a personal computer, a head mount display, a television, a portable book, a DVD player, a digital camera, and a projector.

29. A level shifter comprising:
a first n-channel MOS transistor having a source connected to a first power source, and a gate to which a first input signal is inputted;
a second n-channel MOS transistor having a source connected to said first power source, and a gate to which a second input signal is inputted, wherein said second input signal is an inverted signal of said first input signal;
a third p-channel MOS transistor having a drain connected to a drain of said first n-channel MOS transistor, and a gate to which said first input signal is inputted;
a fourth p-channel MOS transistor having a drain connected to a drain of said second n-channel MOS transistor, and a gate to which said second input signal is inputted;
a fifth p-channel MOS transistor having a drain connected to a source of said third p-channel MOS transistor, and a gate connected to a drain of said second MOS transistor;
a sixth p-channel MOS transistor having a drain connected to a source of said fourth p-channel MOS transistor, and a gate connected to a drain of said first n-channel MOS transistor;
a first voltage regulating circuit connected between a source of said fifth p-channel MOS transistor and a second power source; and
a second voltage regulating circuit connected between a source of said sixth p-channel MOS transistor and said second power source.

30. A level shifter according to claim 29, wherein said voltage regulating circuit comprises a MOS transistor having a drain and a gate thereof connected.

31. A level shifter according to claim 29, wherein said voltage regulating circuit has a resistor containing a polycrystalline silicon layer or a silicon layer doped with an impurity element.

32. A level shifter according to claim 29, wherein said voltage regulating circuit includes a MOS transistor having a constant voltage applied to a gate thereof.

33. A level shifter according to claim 29, wherein a voltage of said first power source is fixed to 0 V.

34. A level shifter according to claim 29, wherein said level shifter is incorporated in an active matrix type liquid crystal display device or a light emitting display device.

35. A level shifter according to claim 29, wherein said level shifter is incorporated in one selected from the group consisting of a mobile telephone, a video camera, a personal computer, a head mount display, a television, a portable book, a DVD player, a digital camera, and a projector.

36. A level shifter comprising:
a first n-channel MOS transistor having a source connected to a first power source, and a gate to which a first input signal is inputted;
a second n-channel MOS transistor having a source connected to said first power source, and a gate to which a second input signal is inputted, wherein said second input signal is an inverted signal of said first input signal;
a third p-channel MOS transistor having a drain connected to a drain of said first n-channel MOS transistor, and a gate connected to a drain of said second n-channel MOS transistor;
a fourth p-channel MOS transistor having a drain connected to a drain of said second n-channel MOS transistor, and a gate connected to a drain of said first n-channel MOS transistor;
a first voltage regulating circuit connected between a source of said third p-channel MOS transistor and a second power source; and
a second voltage regulating circuit connected between a source of said fourth p-channel MOS transistor and said second power source.

37. A level shifter according to claim 36, wherein said voltage regulating circuit comprises a MOS transistor having a drain and a gate thereof connected.

38. A level shifter according to claim 36, wherein said voltage regulating circuit has a resistor containing a polycrystalline silicon layer or a silicon layer doped with an impurity element.

39. A level shifter according to claim 36, wherein said voltage regulating circuit includes a MOS transistor having a constant voltage applied to a gate thereof.

40. A level shifter according to claim 36, wherein a voltage of said first power source is fixed to 0 V.

41. A level shifter according to claim 36, wherein said level shifter is incorporated in an active matrix type liquid crystal display device or a light emitting display device.

42. A level shifter according to claim 36, wherein said level shifter is incorporated in one selected from the group consisting of a mobile telephone, a video camera, a personal computer, a head mount display, a television, a portable book, a DVD player, a digital camera, and a projector.

* * * * *